United States Patent
Takeuchi

(10) Patent No.: US 6,679,709 B2
(45) Date of Patent: Jan. 20, 2004

(54) CONNECTOR AND METHOD FOR MANUFACTURING SAME

(75) Inventor: Shinobu Takeuchi, Adachi-gun (JP)

(73) Assignee: Moldec Co., Ltd., Fukushima (JP)

( * ) Notice: Subject to any disclaimer, the term of this patent is extended or adjusted under 35 U.S.C. 154(b) by 0 days.

(21) Appl. No.: 10/060,296

(22) Filed: Feb. 1, 2002

(65) Prior Publication Data

US 2003/0013330 A1 Jan. 16, 2003

(30) Foreign Application Priority Data

| Jul. 13, 2001 | (JP) | ................................. 2001-214566 |
| Aug. 13, 2001 | (JP) | ................................. 2001-245804 |
| Sep. 10, 2001 | (JP) | ................................. 2001-274251 |
| Nov. 5, 2001 | (JP) | ................................. 2001-339894 |

(51) Int. Cl.⁷ ............................................. H01R 4/02
(52) U.S. Cl. ........................ 439/83; 876/884; 876/342
(58) Field of Search ...................... 439/83, 876, 824, 439/736, 856, 857, 342, 884

(56) References Cited

U.S. PATENT DOCUMENTS

| 4,120,558 A | * | 10/1978 | Seidler | ................ | 439/876 |
| 4,302,067 A | * | 11/1981 | Monson et al. | ........... | 439/876 |
| 4,597,628 A | * | 7/1986 | Seidler | ................ | 439/876 |
| 4,605,278 A | * | 8/1986 | Seidler | ................ | 439/876 |
| 4,664,309 A | * | 5/1987 | Allen et al. | ............... | 439/83 |
| 4,872,846 A | * | 10/1989 | Clark | ................... | 439/83 |
| 5,030,144 A | * | 7/1991 | Seidler | ................ | 439/876 |
| 5,441,430 A | * | 8/1995 | Seidler | ................ | 439/876 |
| 5,484,964 A | | 1/1996 | Dawson | .................. | 174/261 |
| 5,490,040 A | | 2/1996 | Gaudenzi et al. | ........... | 361/773 |
| 5,800,184 A | | 9/1998 | Lopergolo et al. | ........... | 439/66 |
| 6,056,558 A | * | 5/2000 | Lin et al. | ................. | 439/83 |
| 6,116,923 A | * | 9/2000 | Szu | ........................ | 439/83 |
| 6,127,204 A | | 10/2000 | Isaacs et al. | .............. | 438/106 |
| 6,142,792 A | * | 11/2000 | Yang | ...................... | 439/71 |
| 6,217,348 B1 | * | 4/2001 | Lin et al. | ................. | 439/83 |
| 6,247,635 B1 | | 6/2001 | Olson | .................... | 228/118 |
| 6,261,136 B1 | * | 7/2001 | Dennis | .................. | 439/83 |
| 6,274,474 B1 | | 8/2001 | Caletka et al. | ............ | 438/613 |
| 6,371,784 B1 | * | 4/2002 | Scholz et al. | .............. | 439/342 |
| 6,402,574 B2 | * | 6/2002 | Cachina et al. | ............ | 439/876 |
| 6,533,590 B1 | * | 3/2003 | Lee et al. | ................. | 439/876 |
| 2001/0041481 A1 | | 11/2001 | Cachina et al. | ............ | 439/876 |
| 2001/0045009 A1 | | 11/2001 | Cachina et al. | ............ | 29/840 |

* cited by examiner

*Primary Examiner*—Renee Luebke
*Assistant Examiner*—Briggitte R. Hammond
(74) *Attorney, Agent, or Firm*—Paul A. Guss

(57) ABSTRACT

The invention provides a connector which is easily manufactured and connects a circuit board in good condition. The connector according to the invention is a CPU socket to be surface-mounted on a circuit board 2, comprising a terminal 5 attached inside an internal case 4a made of an insulating material and a solder 6 fixed to the terminal 5. A connecting section 11 of the terminal 5 is provided with a pair of bar-like pieces 12, and has first claw sections 13 and a second claw section 14. In order to fix the solder 6 to the connecting section 11, tip ends of the first claw sections 13 are caulked by bending so that the tip ends contact with each other. The connecting section 11 is provided with an internal passage 15 connecting the upper and lower sides thereof. The solder 6 does not come off the terminal 5 because the solder 6 is attached to the internal case 4a after fixed to the connecting section 11 of the terminal 5 by caulking. In addition, it is easy to improve coplanarity of the tip end of each solder 6 because a length of the solder 6 protruding from the connecting section 11 is adjustable by changing the caulking position of the solder 6.

25 Claims, 14 Drawing Sheets

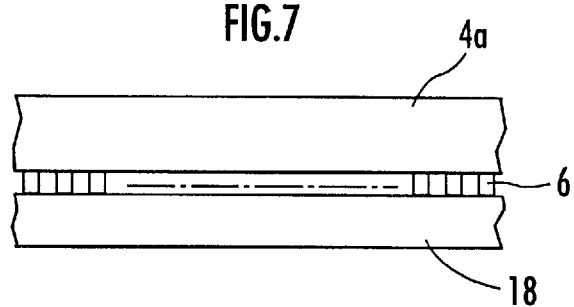
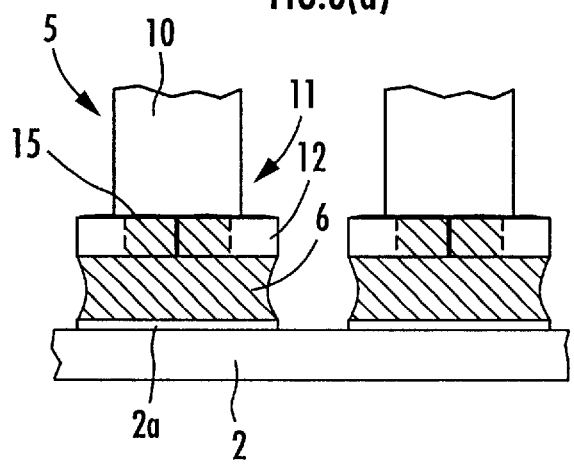 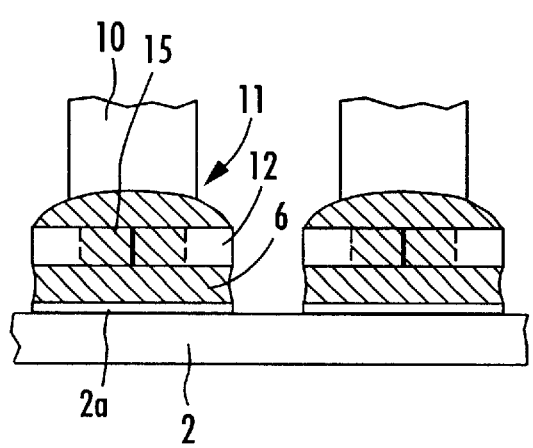
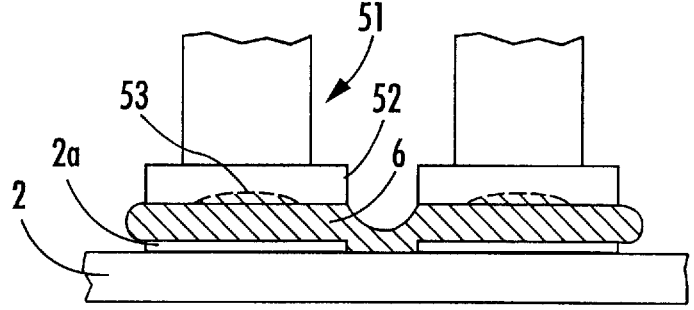

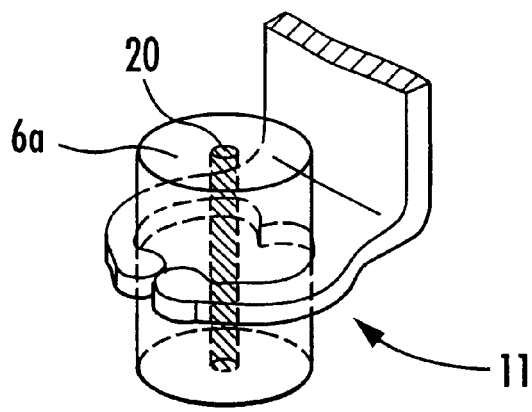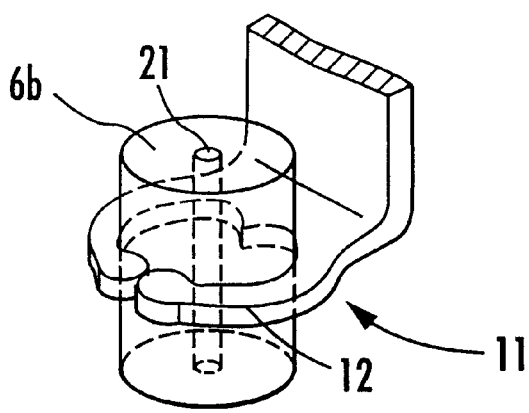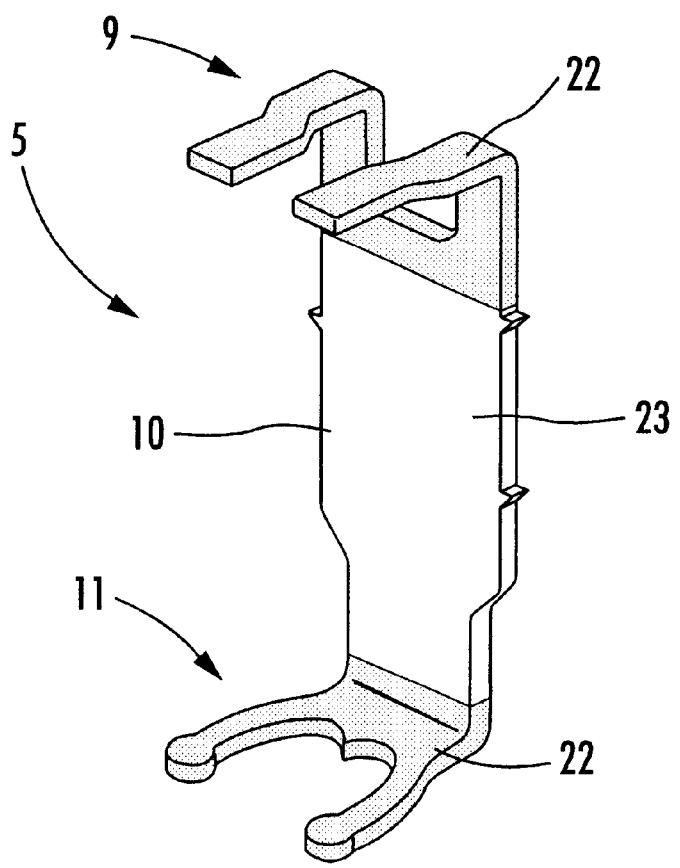

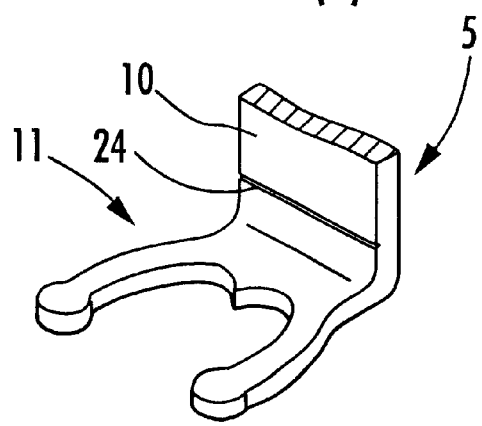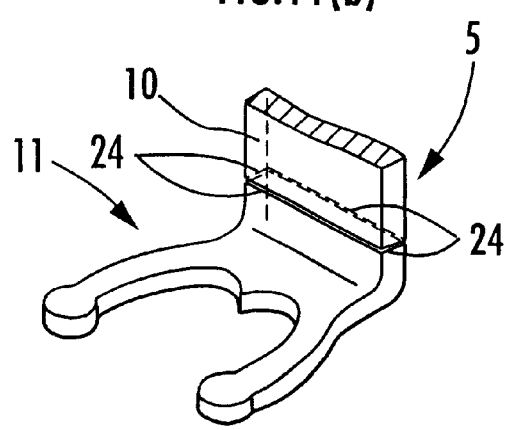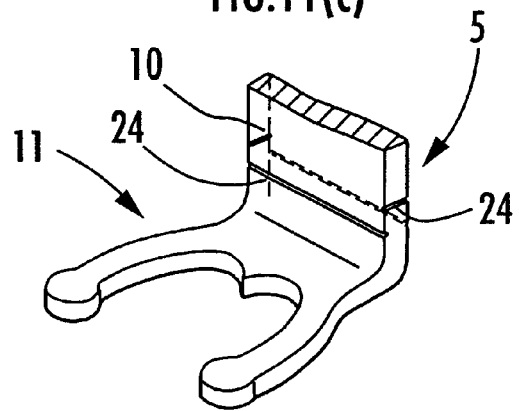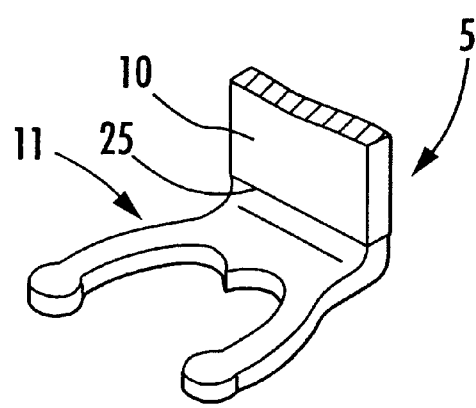

CONNECTOR AND METHOD FOR MANUFACTURING SAME

BACKGROUND OF THE INVENTION

1. Field of the Invention

The invention relates to a connector for mounting an integrated circuit on a circuit board or a connector for connecting a circuit board to another circuit board, and a method for manufacturing such a connector.

2. Description of the Related Art

A ball grid alley type (hereafter referred to as BGA type) connector is conventionally used as a means for mounting an integrated circuit or a circuit board on another circuit board. This BGA type connector comprises a case formed of an insulating material and placed on the circuit board, a through-hole penetrating the case vertically, and a terminal electrically connecting a pin attached to the through-hole to an electrical circuit of the circuit board via a solder ball acting as a thermally fusible conductive material. This solder ball is attached to a concave portion located at a position where the through-hole faces the circuit board. The solder ball is attached in a manner it is partially welded at a lower end of the terminal. The electrical circuit of the circuit board is connected to the terminal by placing the connector on the circuit board with the solder ball mounted and by heating these members to melt the solder ball.

The solder ball between the circuit board and the terminal used by such BGA type connector of the prior art as mentioned above sometimes has a problem that the solder ball comes off the concave portion of the case before being attached to the circuit board, resulting in incomplete connection. It is difficult to manufacture a solder ball having no deformation in a process of once melting solder to form it spherically. The solder ball may be deformed before being attached to the connector because of its low hardness. Therefore, it is difficult to secure coplanarity that shows degree of how uniformly the height of the lower end of each solder ball is horizontally aligned when the solder ball is used to connect the circuit board to the terminal. Thus, there arise places where some solder balls are in contact with the circuit board while the other solder balls are not when the case with the solder balls attached to is placed on the circuit board. This may cause incomplete connection between the terminal and the electrical circuit when the solder balls are melted.

A manufacturing cost of the solder balls themselves becomes high because they must be formed precisely. As it is necessary to surely arrange the solder ball on the concave portion provided in the case and to securely fix it on the terminal, there are problems that manufacturing processes become complicated, and the total cost of manufacturing connectors becomes high.

SUMMARY OF THE INVENTION

An object of the invention is to improve a connector, more specifically to provide a connector which can be easily manufactured and can be connected to a circuit board in good condition in order to solve the problems.

In order to achieve the object, a connector according to a first embodiment of the invention is one to be surface-mounted on a circuit board having an electrical circuit and used to attachably connect an integrated circuit or another connector provided with a plurality of pins extending downward to the circuit board having the following features:

Firstly the connector comprises a case made of an insulating material, a through-hole penetrating the case vertically and into which the pin is inserted, a terminal having a contact section provided in the through-hole to be in contact with the pin, a connecting section facing the electrical circuit and a body section joining the contact section and the connecting section, and a thermally fusible conductive material existing between the connecting section and the electrical circuit. The connecting section extends substantially in parallel with the circuit board and comprises an internal passage connecting upper and lower sides of the connecting section, and the thermally fusible conductive material is attached to the upper and lower sides of the connecting section through the internal passage.

As the thermally fusible conductive material is vertically arranged on the connecting section through the internal passage, the connector according to the first embodiment of the invention can freely move between the upper and lower sides of the connecting section through the internal passage when the thermally fusible conductive material is heated and melted. When the connector is surface-mounted on the circuit board, the thermally fusible conductive material is heated in a condition of being in contact with the electrical circuit. When a space formed between the connecting section and the electrical circuit is filled with the heated and melted thermally fusible conductive material, an excessive amount thereof between the connecting section and the electrical circuit moves upward through the internal passage. Therefore, short circuit to the thermally fusible conductive material of an adjacent terminal and to the electrical circuit can be prevented because no thermally fusible conductive material extends in the right and left direction.

On the other hand, when the connectors are surface-mounted on the circuit board, the thermally fusible conductive material is heated and melted in the condition the thermally fusible conductive material is in contact with the electrical circuit, and when the space formed between the connecting section and the electrical circuit is not filled with the thermally fusible conductive material located in the lower side of the connecting section, the thermally fusible conductive material existing in the upper side of the connecting section moves to the lower side of the connecting section through the internal passage to fill the space between the connecting section and the electrical circuit. Thus the connecting section and the electrical circuit are surely connected.

As mentioned above, according to the first embodiment, even when a clearance between the connecting section and the electrical circuit varies, or even when an amount of the thermally fusible conductive material located at the lower side of the connecting section varies, vertical movement of the heated and melted thermally fusible conductive material enables an appropriate amount of the thermally fusible conductive material to always fill the space between the connecting section and the electrical circuit. Therefore, it is possible to prevent the short circuit to the thermally fusible conductive material of the adjacent terminal or to the electrical circuit or lack of the amount of the thermally fusible conductive material between the connecting section and the electrical circuit.

In the connector according to the first embodiment, it is possible to form the connecting section into a pair of bar-shaped pieces extending and branching substantially in parallel with the electrical circuit, and to form the internal passage by allowing the tip ends of the pair of bar-shaped pieces to be close to each other to provide an annular or a C-letter-like shape. In addition, it is possible to form the connecting section into a plate substantially in parallel with the circuit board, and to form the internal passage into a connecting hole connecting the upper and lower sides of the connecting section. The internal passage can be also formed through the connecting section by providing the connecting section with such shape.

In the connector according to the first embodiment, it is preferable that a surface of the body section comprises a groove or a step. When the surface of the body section is provided with the groove or the step like this, the heated and melted thermally fusible conductive material is prevented from moving upward along the surface of the body section because the groove or the step blocks a way of the thermally fusible conductive material going to move upward. Thus, a sufficient amount of the thermally fusible conductive material filling the space between the connecting section and the electrical circuit can be secured.

It is possible to coat the surface of the body section close to the connecting section with a substance having low wettability of solder. One of the substances having low wettability of solder is, for example, metal plating such as nickel plating. As coating of the surface of the body section with the substance having the low wettability of solder can prevent the heated and melted thermally fusible conductive material from moving upward over a position coated with the substance, a sufficient amount of the thermally fusible conductive material filling the space between the connecting section and the electrical circuit can be secured.

A connector according to a second embodiment of the invention is one to be surface-mounted on a circuit board having electrical circuit and to attachably connect an integrated circuit or another connector provided with a plurality of pins extending downward to the circuit board having the following features:

Firstly the connector comprises a case made of an insulating material, a through-hole penetrating the case vertically and into which the pin is inserted, a terminal having a contact section provided in the through-hole to be in contact with the pin and a connecting section facing the electrical circuit, and a thermally fusible conductive material existing between the connecting section and the electrical circuit. The connecting section comprises a pair of bar-shaped pieces branching and extending substantially in parallel with the circuit board, and the thermally fusible conductive material is held between the pair of bar-shaped pieces and fixed by caulking. Holding the thermally fusible conductive material between the pair of bar-shaped pieces and caulking like this enables the thermally fusible conductive material to be fixed on the connecting section securely.

In the connector according to the second embodiment, it is preferable that the pair of bar-like pieces comprises a pair of first claw sections protruding inward from both sides at the tip ends each other and a second claw section at the root portion, and when the thermally fusible conductive material is fixed to the pair of bar-like pieces by caulking, the first claw sections and the second claw section penetrated into the thermally fusible conductive material, enables the thermally fusible conductive material to be fixed to the connecting section more securely.

It is possible to form the connecting section into an annular shape by allowing tip ends of the pair of bar-shaped pieces to be in contact with each other, or into the one having a C-letter-like shape by allowing the tip ends of the pair of bar-shaped pieces to have specified clearance between them.

A connector according to a third embodiment of the invention is one to be surface-mounted on a circuit board having an electrical circuit and to attachably connect an integrated circuit or another circuit provided with a plurality of pins extending downward to the circuit board having the following features:

Firstly the connector comprises a case made of an insulating material, a through-hole penetrating the case vertically and into which the pin is inserted, a terminal having a contact section provided in the through-hole to be in contact with the pin and a connecting section facing the electrical circuit, and a thermally fusible conductive material existing between the connecting section and the electrical circuit. The connecting section is formed to be a plate substantially in parallel with the circuit board and provided with an internal passage penetrating from one side to the other, and the thermally fusible conductive material is inserted through the internal passage and fixed. The connector according to the third embodiment can prevent the thermally fusible conductive material from coming off the terminal because the thermally fusible conductive material is inserted and fixed in the internal passage.

As for a method for fixing the thermally fusible conductive material in the internal passage, the internal passage can be formed to be a round hole, and the thermally fusible conductive material can be fixed by caulking by crushing the round hole at a side of the connecting section from one side to deform it into a heart-like shape hole as viewed horizontally. The thermally fusible conductive material can be fixed by caulking by crushing the round hole at a side of the connecting section from two sides to deform it into an 8-letter-like shape as viewed horizontally. The thermally fusible conductive material can be fixed by caulking by crushing the round hole at the sides of the connecting section from at least three sides to deform it into a nearly rectangular shape hole as viewed horizontally.

The internal passage can be formed to be a connecting hole, and the thermally fusible conductive material can be fixed by caulking by externally pressing and bending the connecting section in a diagonal direction to reduce an opening area of the connecting hole.

The internal passage can be formed to be the connecting hole, and the thermally fusible conductive material can be fixed to the connecting section by caulking by deforming to make a width larger than that of the connecting hole at the upper and lower sides of the connecting section in a condition the thermally fusible conductive material is inserted into the connecting hole. When the thermally fusible conductive material is deformed to be fixed by caulking, the shape of the thermally fusible conductive material facing the circuit board can be made uniform at a time of caulking. Therefore, the terminal and the electrical circuit can be surely connected because coplanarity of each thermally fusible conductive material protruding from the case can be improved.

The internal passage can be formed to be the connecting hole, and the thermally fusible conductive material can be fixed by being press fitted in the connecting hole. In this case, the thermally fusible conductive material can be formed to be the one slightly wider than the connecting hole or an inner wall of the connecting hole can be provided with projections protruding in the internal direction to allow the thermally fusible conductive material to be press fitted so that the projections penetrate into the thermally fusible conductive material. The internal passage can be formed to be a recess cut in from the tip end of the connecting section, and the thermally fusible conductive material can be fixed by being press fitted in the recess.

A connector according to a fourth embodiment of the invention is one to be surface-mounted on a circuit board having an electrical circuit and to attachably connect an integrated circuit or another connector provided with a plurality of pins extending downward to the circuit board having the following features:

Firstly the connector comprises a case made of an insulating material, a through-hole penetrating the case vertically and into which the pin is inserted, a terminal having a contact section provided in the through-hole to be in contact with the pin and a connecting section facing the electrical circuit, and a thermally fusible conductive material existing between the connecting section and the electrical circuit. The connecting section is formed to be a plate substantially in parallel with the circuit board and provided with a pair of recesses from both sides, and the thermally fusible conductive material is formed into wire and fixed in a condition of being wound around the pair of recesses.

A connector according to a fifth embodiment of the invention is one to be surface-mounted on a circuit board having an electrical circuit and to attachably connect an integrated circuit or another connector provided with a plurality of pins extending downward to the circuit board having the following features:

Firstly the connector comprises a case made of an insulating material, a through-hole penetrating the case from one side to the other and into which the pin is inserted, a terminal having a contact section provided in the through-hole to be in contact with the pin and a connecting section facing the electrical circuit, and a thermally fusible conductive material existing between the connecting section and the electrical circuit and fixed to the connecting section. The thermally fusible conductive material is provided with a projection having a wall thickness reducing toward the circuit board side.

In the connector according to the fifth embodiment of the invention, the thermally fusible conductive material is provided with a projection having a wall thickness reducing toward the circuit board side and the projection has a surface area per volume larger than spherical material like a solder ball because it has a thin wall. Therefore, when ambient temperature is raised to allow the thermally fusible conductive material to be melted, the projection is easily melted by absorbing heat. As the thermally fusible conductive material provided with the projections is melted more easily than the solder ball like this, time required for heating the circuit board and the connector is reduced, leading to an improvement of productivity of the circuit board on which the connector is surface-mounted.

The bottom surface of the case is provided with a plurality of the thermally fusible conductive materials of which tip ends have projections. Therefore, even when coplanarity of the tip end of each projection is not so good, the connecting section of the terminal and the electrical circuit can be connected in good condition because the tip end of the projection is easily melted by heating at a time of surface mounting, resulting in high coplanarity.

In the connector according to this fifth embodiment, the projection can be formed into a conical shape having a diameter reducing toward the circuit board, it can be formed into a cross shape protruding toward the circuit board, or it can be formed into a cylinder toward the circuit board and internally provided with a depression having a diameter enlarging toward the circuit board side.

In the connector according to the first through fifth embodiments, the thermally fusible conductive material can be a solder having a cylindrical body extending vertically which is filled with flux. As the flux has a property to allow the solder to be easily melted, using the solder containing the flux as the thermally fusible conductive material enables the solder to be melted in a short time when the connector is heated to be surface-mounted on the circuit board.

In the connector according to the first through fifth embodiments, the thermally fusible conductive material can be a cylindrical solder having a central hole penetrating vertically, and attached to the connecting section to connect between the upper and lower sides of the connecting section by the central hole. Cream solder is generally applied to the surface of an electrical circuit and often contains flux. Therefore, when the connector is heated to be surface-mounted on the circuit board, the solder is melted in a short time because the flux contained in the cream solder of the electrical circuit is evaporated and enters an interior of the solder through the central hole.

A method for manufacturing a connector according to the first embodiment of the invention is one for manufacturing a connector to be surface-mounted on a circuit board having an electrical circuit, to attachably connect an integrated circuit or another connector provided with a plurality of pins extending downward to the circuit board comprising a case made of an insulating material, a through-hole penetrating the case vertically and into which the pin is inserted, a terminal having a contact section provided in the through-hole to be in contact with the pin and a connecting section facing the electrical circuit, and a thermally fusible conductive material existing between the connecting section and the electrical circuit and fixed to the connecting section, and having the following processes.

Firstly, there is a terminal forming process for forming a pair of bar-shaped pieces extending and branching substantially in parallel with the circuit board in forming the terminal by punching a metal sheet. Then there is a conductive material fixing process for forming after holding the thermally fusible conductive material between the pair of bar-shaped pieces by caulking, or holding the thermally fusible conductive material, which has been formed into a specified shape, between the pair of bar-shaped pieces by caulking. There is an attaching process for attaching the terminal filled with the thermally fusible conductive material to the through-hole of the case.

A method for manufacturing a connector according to the second embodiment of the invention is one for manufacturing a connector to be surface-mounted on a circuit board having an electrical circuit, to attachably connect an integrated circuit provided with a plurality of pins extending downward to the circuit board or connect the circuit board to another one, comprising a case made of an insulating material, a through-hole penetrating the case vertically and into which the pin is inserted, a terminal having a contact section provided in the through-hole to be in contact with the pin and a connecting section facing the electrical circuit and fixed to the connecting section, and a thermally fusible conductive material existing between the connecting section and the electrical circuit and fixed to the connecting section, and having the following processes.

Firstly, there is a terminal forming process for forming a connecting hole penetrating from one side to the other in the connecting section when in forming the terminal by punching a metal sheet. Then there is a conductive material fixing process for inserting the thermally fusible conductive material through the connecting hole and deforming the connecting section to fix the thermally fusible conductive material by caulking, or inserting the thermally fusible conductive material through the connecting hole and deforming it at upper and lower sides of the connecting hole to fix the connecting section by caulking, or fixing the thermally fusible conductive material to the connecting section by being press fitted in the connecting hole. There is an attaching process for attaching the terminal with the thermally fusible conductive material fixed to the penetrating hole of the case.

By the methods for manufacturing the connectors according to the first and second embodiments, the thermally fusible conductive material is securely fixed to the terminal because the thermally fusible conductive material is attached to the case in a condition the thermally fusible conductive material is fixed to the terminal in the conductive material fixing process. As it is not necessary to form the solder ball as in the prior art, the thermally fusible conductive material such as wire solder can be used at low cost without using expensive solder ball. It is necessary only to attach the terminal with the thermally fusible conductive material fixed, to the case, and a complicated process wherein the solder ball is placed in a concave portion provided on a bottom surface of the case in order to be fixed to the terminal as in the prior art is not required. Thus, the cost for manufacturing the connectors can be reduced.

As for the methods for manufacturing the connectors according to the first and second embodiments, it is preferable to provide a horizontally aligning process wherein the tip ends of the thermally fusible conductive material protruding toward the circuit board side are horizontally aligned after the attaching process. As each of the thermally fusible conductive material can be made in contact with the electrical circuit in the horizontally aligning process when the connector is placed on the circuit board, the terminal can be securely connected to the electrical circuit when the thermally fusible conductive material is melted.

In the horizontally aligning process, tip ends of the thermally fusible conductive material can be horizontally aligned by allowing the tip ends of the thermally fusible conductive material protruding toward the circuit board side to be in contact with a horizontal plate and pressing them toward the horizontal plate in order to align the tip ends horizontally to deform the tip ends of the thermally fusible conductive material. In the horizontally aligning process, the tip ends of the thermally fusible conductive material protruding toward the circuit board side can be allowed to be in contact with the horizontal plate heated at a temperature close to but less than a melting point of the thermally fusible conductive material and can be horizontally aligned by deforming the tip ends of the thermally fusible conductive material by heat.

In the thermally fusible conductive material fixing process by the method for manufacturing the connectors according to the first and second embodiments, when the thermally fusible conductive material is fixed to the connecting section, a length of the thermally fusible conductive material protruding from the connecting section to the electrical circuit side can be determined corresponding to a clearance between the case and the circuit board when the case is placed on the circuit board in a condition the terminal and the thermally fusible conductive material are attached.

In the prior art, the clearance (standoff) between the case and the circuit board is adjusted by changing a diameter of a solder ball, however changing a diameter of the solder ball leads to an increase of cost such as equipment investment because it is necessary to modify equipment for positioning the solder balls at the time of welding the solder balls on the terminal. By the method for manufacturing the connectors according to the first and second embodiments, the standoff can be easily adjusted by changing a position where the thermally fusible conductive material is held by the connecting section in the thermally fusible conductive material fixing process or by changing the length of the thermally fusible conductive material. Therefore, the standoff can be easily adjusted corresponding to a variety of standards without causing a great cost increase as in the prior art.

A method for manufacturing a connector according to the third embodiment of the invention is a method for manufacturing a connector to be surface-mounted on a circuit board having an electrical circuit, to attachably connect an integrated circuit provided with a plurality of pins extending downward to the circuit board or connect the circuit board to another one, comprising a case made of an insulating material, a through-hole penetrating the case vertically and into which the pin is inserted, a terminal having a contact section provided in the through-hole to be in contact with the pin and a connecting section facing the electrical circuit and fixed to the connecting section, and a thermally fusible conductive material existing between the connecting section and the electrical circuit and fixed to the connecting section, and having the following processes.

Firstly, there is a terminal forming process wherein a connecting hole or a recess penetrating from one side to the other of the connecting section in forming the terminal by punching a metal sheet. Then, there is an attaching process for attaching the terminal to the penetrating hole of the case. There is a conductive material forming process for forming a projection having a wall thickness reducing toward the electrical circuit side and forming an inserting section having a diameter smaller than that of the connecting hole or the recess of the connecting section in the terminal side. There is a conductive material fixing process for arranging the thermally fusible conductive material according to the position of the terminal, inserting the inserting section into the connecting hole or the recess, and caulking the inserting section from the upper side of the connecting section to be deformed so as to have a diameter larger than that of the connecting hole or the recess in order to fix the thermally fusible conductive material to the connecting section of the terminal by caulking.

By the method for manufacturing a connector according to the third embodiment, the thermally fusible conductive material can be prevented from coming off the terminal because the inserting section is inserted into the connecting hole or the recess provided at the connecting section of the terminal to fix the thermally fusible conductive material by caulking.

BRIEF DESCRIPTION OF THE DRAWINGS

FIG. 7 is a schematic diagram showing a process for improving coplanarity at ends of the solder.

FIG. 8 is a schematic diagram showing connecting condition between the terminal and an electronic circuit on a circuit board according to this embodiment and a comparison example.

FIG. 9 is a schematic diagram showing other types of the solder.

FIG. 10 is a schematic diagram showing typical plating on a surface of the terminal.

FIG. 11 is a schematic diagram showing a configuration for preventing the solder from flowing along a body section of the terminal.

DESCRIPTION OF THE PREFERRED EMBODIMENTS

Figure 1:
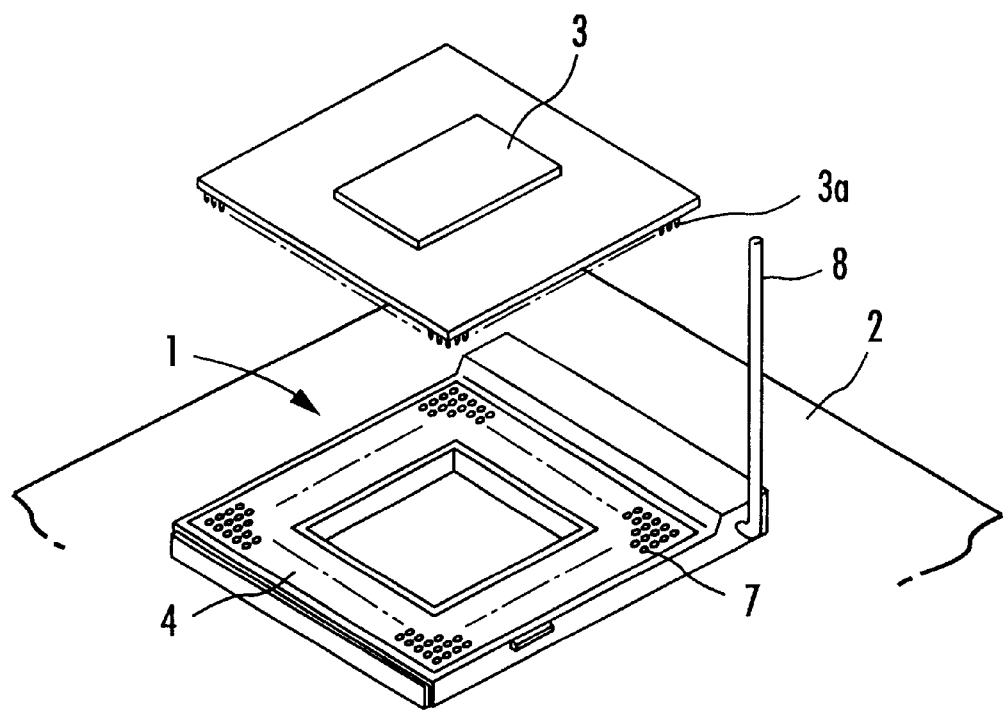
FIG. 1 is a schematic diagram of a typical connector embodying the invention.

A typical connector embodying the invention is described referring to FIGS. 1 through 19. FIG. 1 is a schematic diagram of a connector embodying the invention, FIG. 2 an enlarged fragmentary cross sectional view of the connector according to a first embodiment, FIG. 3 a partial plan view showing a state of an internal case according to the first embodiment, FIG. 4 a schematic diagram showing a terminal of the connector according to the first embodiment, FIGS. 5a and 5b schematic diagrams showing manufacturing processes of the connector according to the first embodiment, FIGS. 6a through 6c schematic diagrams showing methods for fixing a solder in the terminal, FIG. 7 a schematic diagram showing process for improving coplanarity at an end of the solder, FIGS. 8a through 8c schematic diagrams showing connecting conditions between the terminal and an electronic circuit on a circuit board according to this embodiment and a comparison example, FIGS. 9a and 9b schematic diagrams showing other types of the solder, FIG. 10 is a schematic diagram showing typical plating on a surface of the terminal, and FIGS. 11a through 11d schematic diagrams showing configurations for preventing the solder from flowing along a body section of the terminal.

Figure 12:
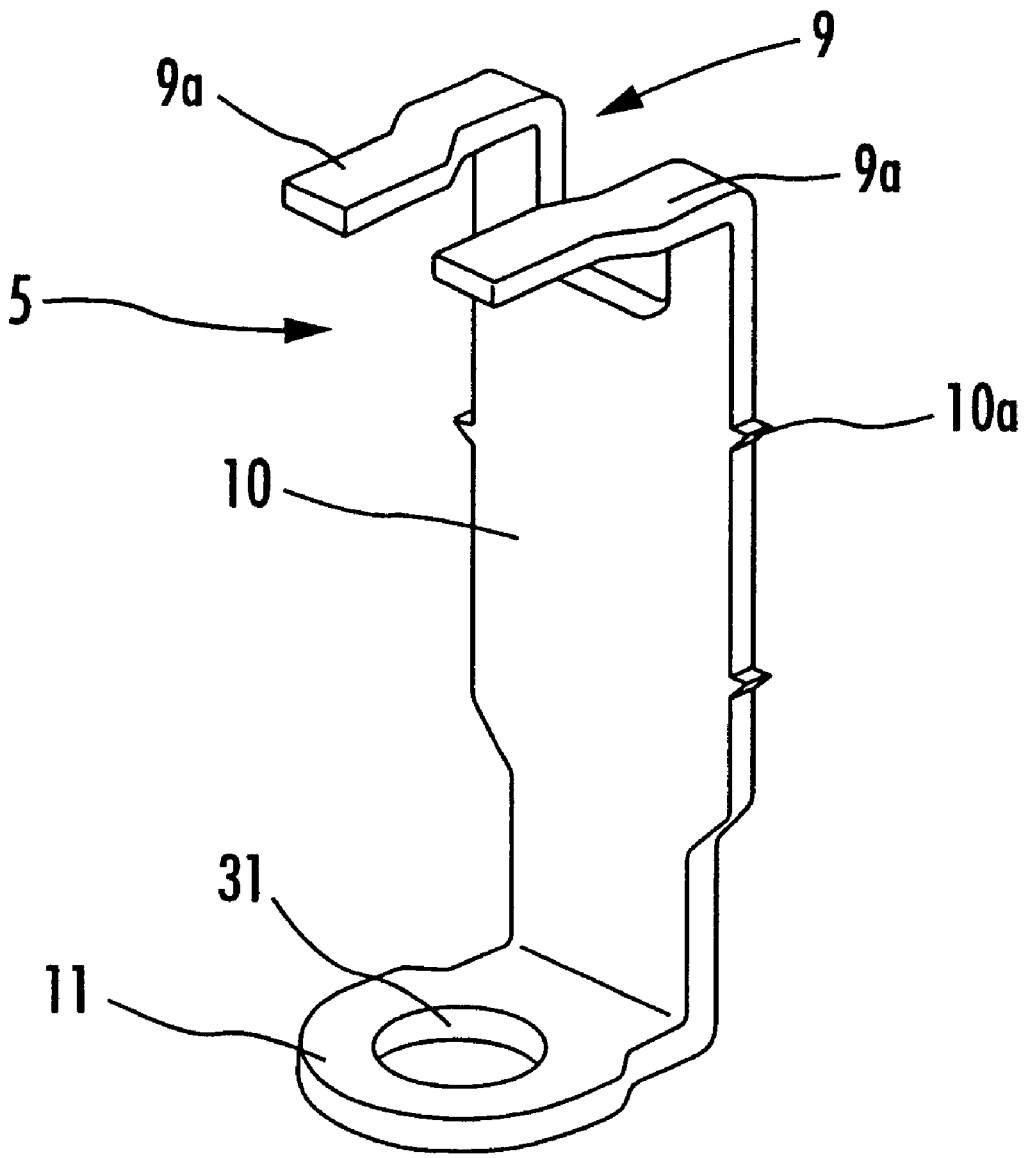
FIG. 12 is a schematic diagram showing a terminal used for a connector according to the second embodiment.
Figure 13A:
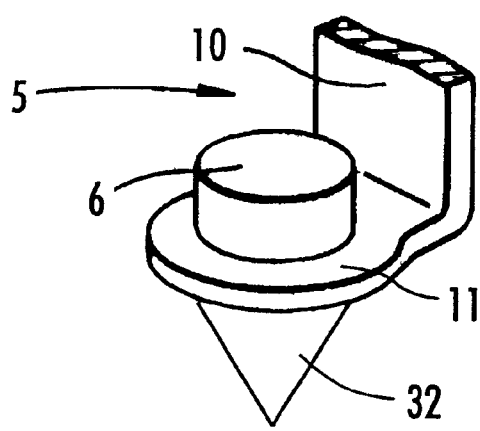
FIG. 13 is a schematic diagram showing a fixing condition of the solder according to the second embodiment.
Figure 13B:
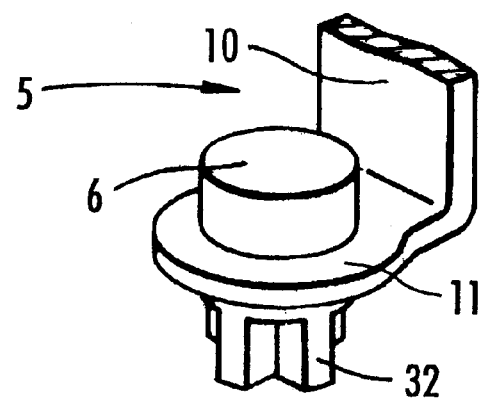
Figure 13C:
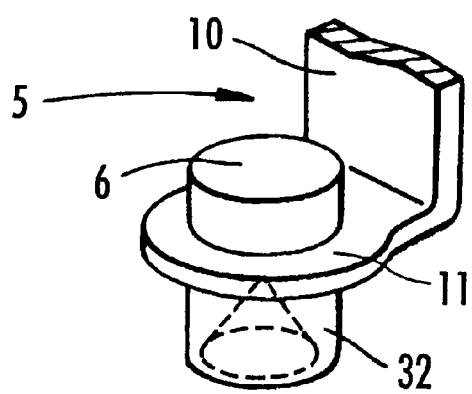
Figure 13D:
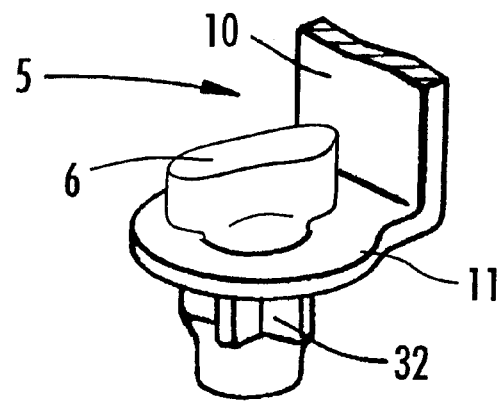
Figure 14A:
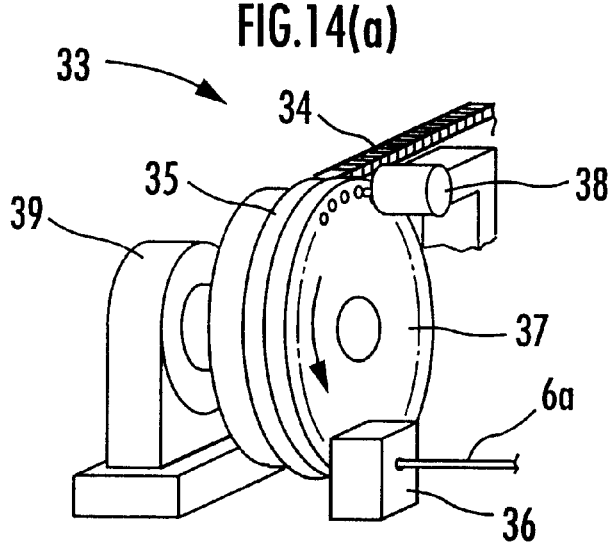
FIG. 14 is a schematic diagram showing a device for fixing the solder to the terminal according to the second embodiment.
Figure 14B:
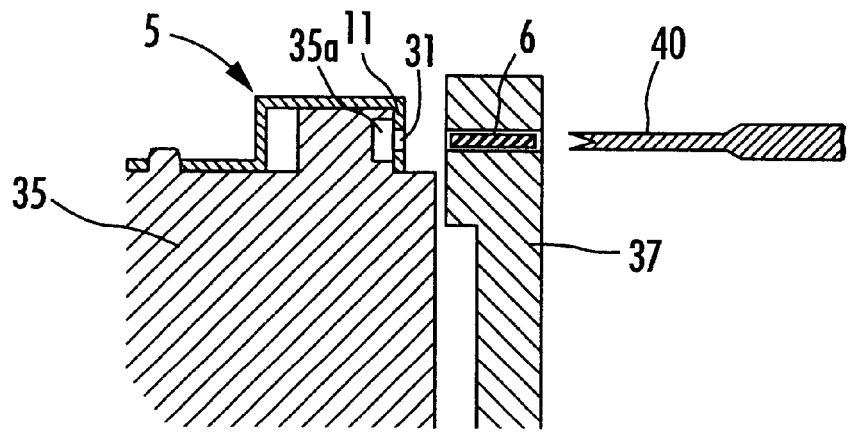
Figure 14C:
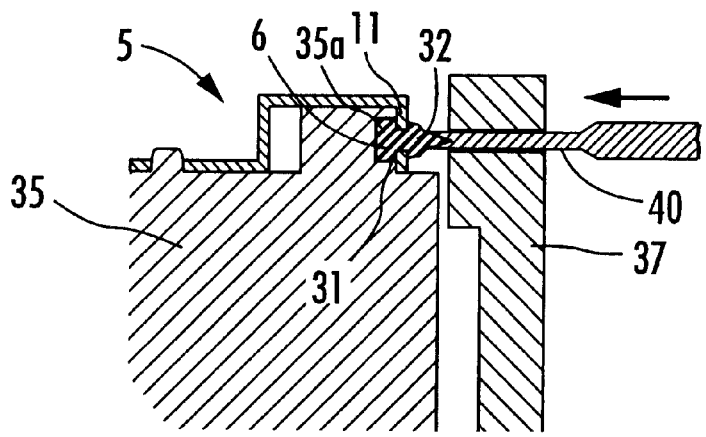
Figure 15A:
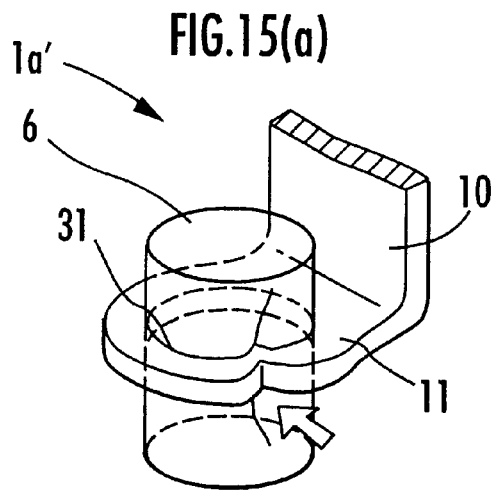
FIG. 15 is a schematic diagram showing a modification according to the second embodiment.
Figure 15B:
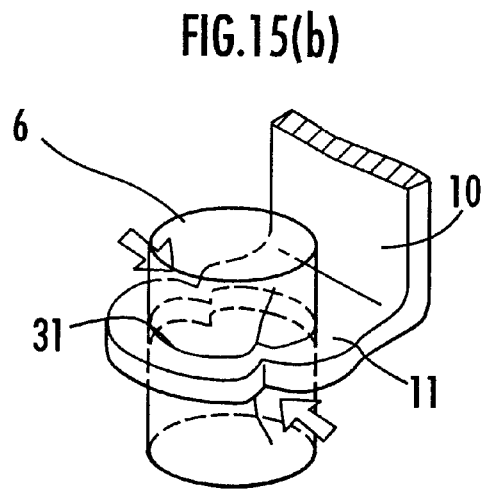
Figure 15C:
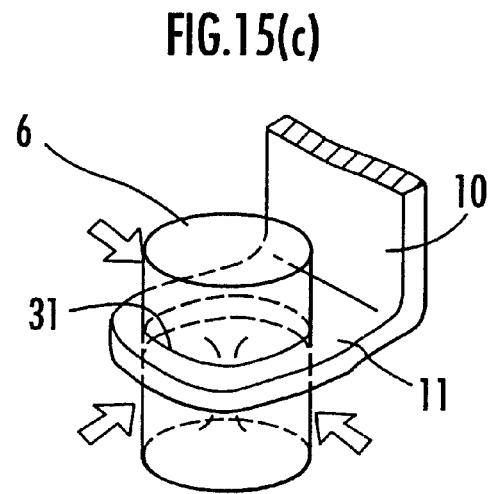
Figure 15D:
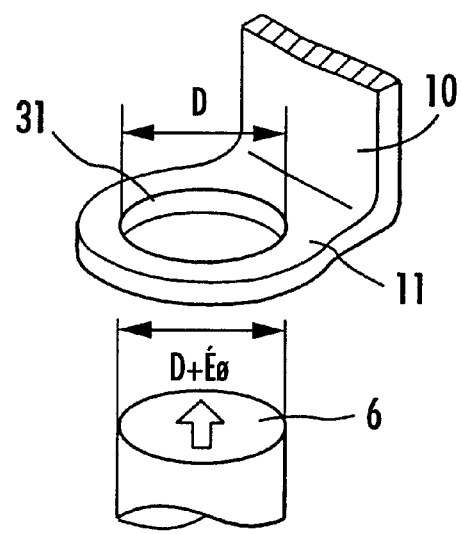
Figure 15E:
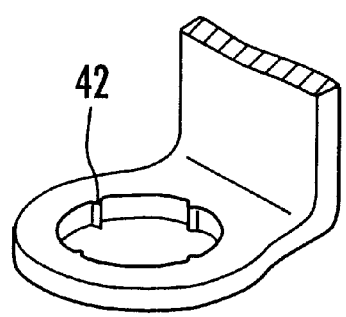
Figure 15F:
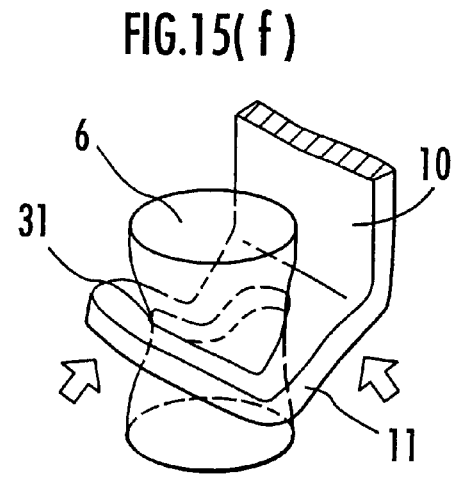
Figure 16A:
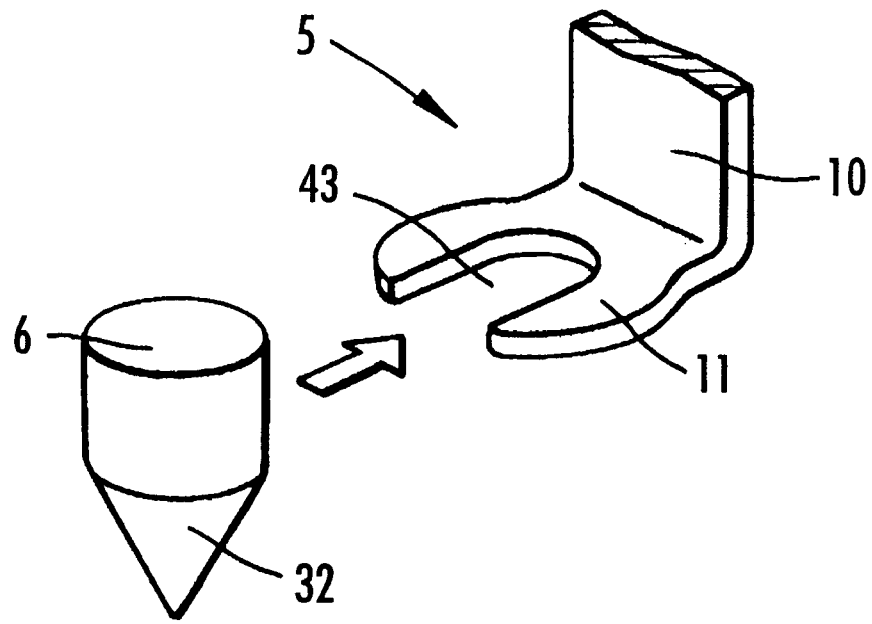
FIG. 16 is a schematic diagram showing another modification according to the second embodiment.
Figure 16B:
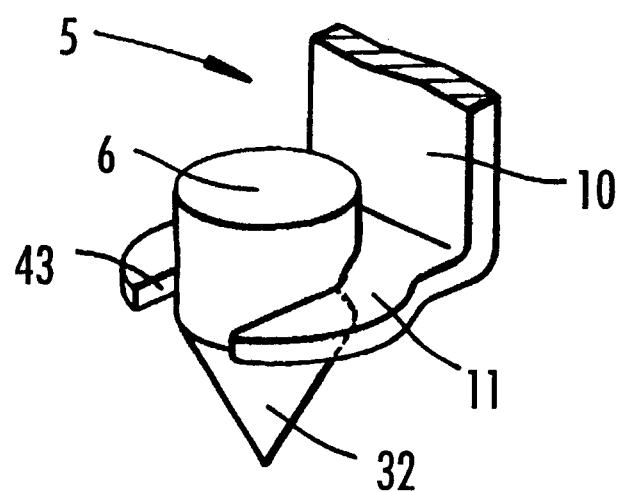
Figure 17:
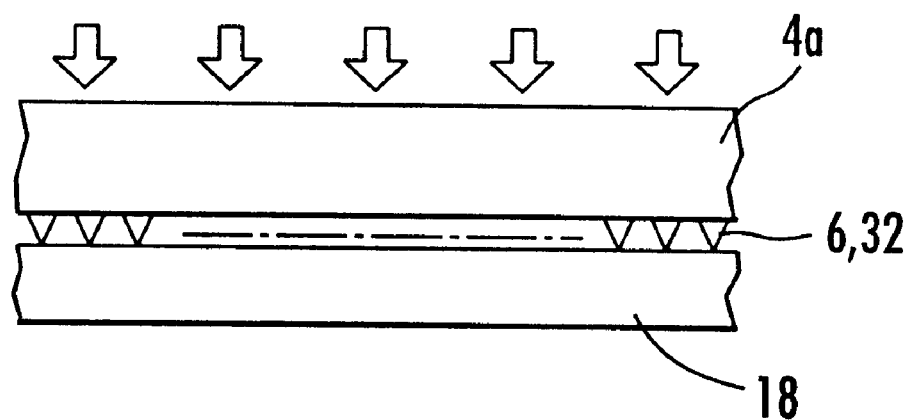
FIG. 17 is a schematic diagram showing a process for improving coplanarity at ends of the solder.
Figure 18:
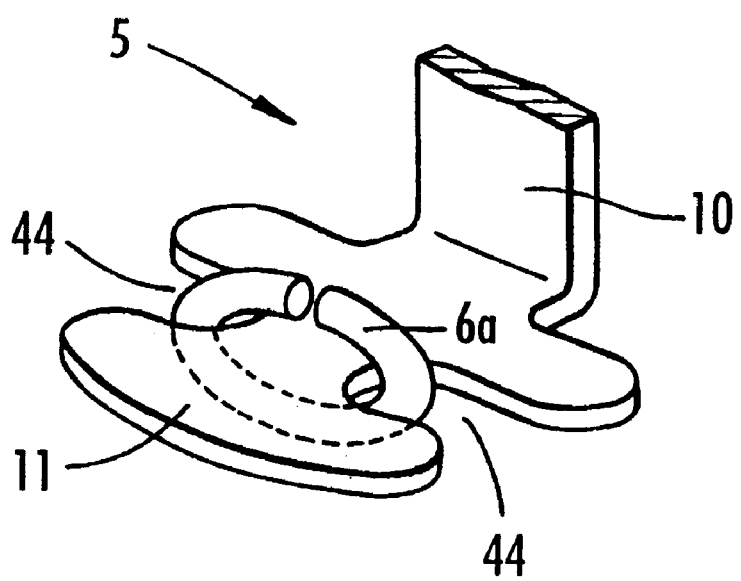
FIG. 18 is a schematic diagram showing a state of the terminal and the solder of the connector according to the third embodiment.
Figure 19A:
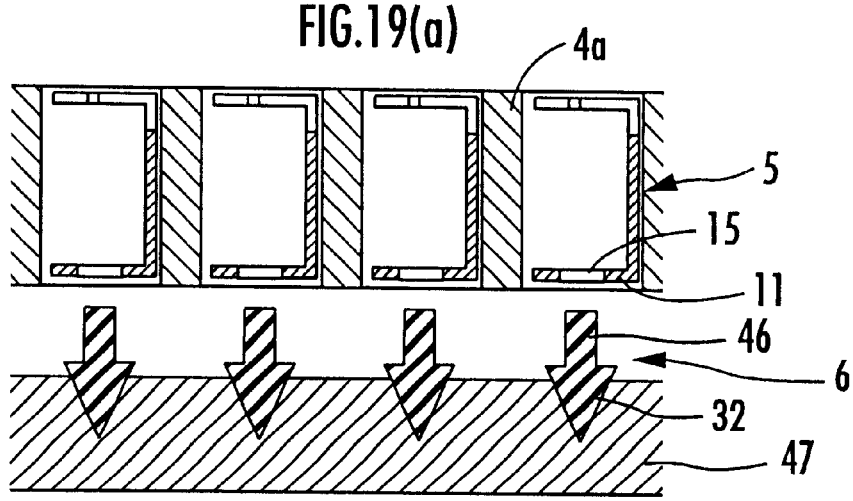
FIG. 19 is a schematic diagram showing another embodiment in a method for manufacturing the connector of the invention.
Figure 19B:
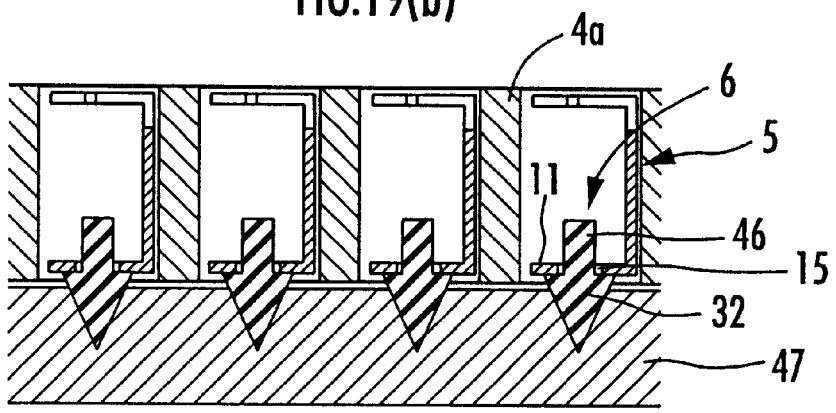
Figure 19C:
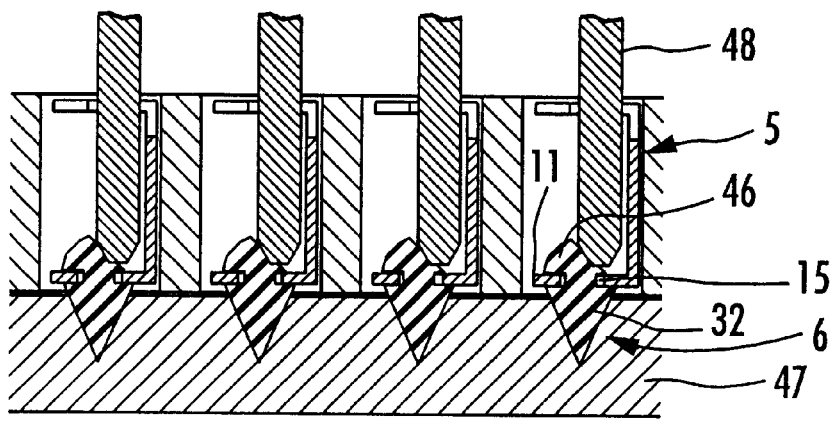

FIG. 12 is a schematic diagram showing a terminal used for a connector according to a second embodiment, FIGS. 13a through 13d schematic diagrams showing fixing conditions of the solder according to the second embodiment, FIGS. 14a through 14c schematic diagrams showing a device for fixing the solder in the terminal according to the second embodiment, FIGS. 15a through 15f schematic diagrams showing modification of the second embodiment, FIGS. 16a and 16b schematic diagrams showing the other modifications of the second embodiment, FIG. 17 a schematic diagram showing a process for improving coplanarity at ends of the solder, FIG. 18 a schematic diagram showing a state of a terminal and a solder of the connector according to a third embodiment, FIGS. 19a through 19c schematic diagrams showing the other embodiments by methods for manufacturing the connector of the invention.

Firstly, a first embodiment of the invention is described. A connector 1 according to the first embodiment is surface-mounted on a circuit board 2 and is a CPU socket attachably connecting a CPU (integrated circuit) 3 to the circuit board 2 as shown in FIG. 1. The connector 1 according to the first embodiment comprises a case 4 made of an insulating material, a terminal 5 installed inside the case 4 as shown in FIG. 2, and a solder (thermally fusible conductive material) 6 held by the terminal 5.

Figure 2:
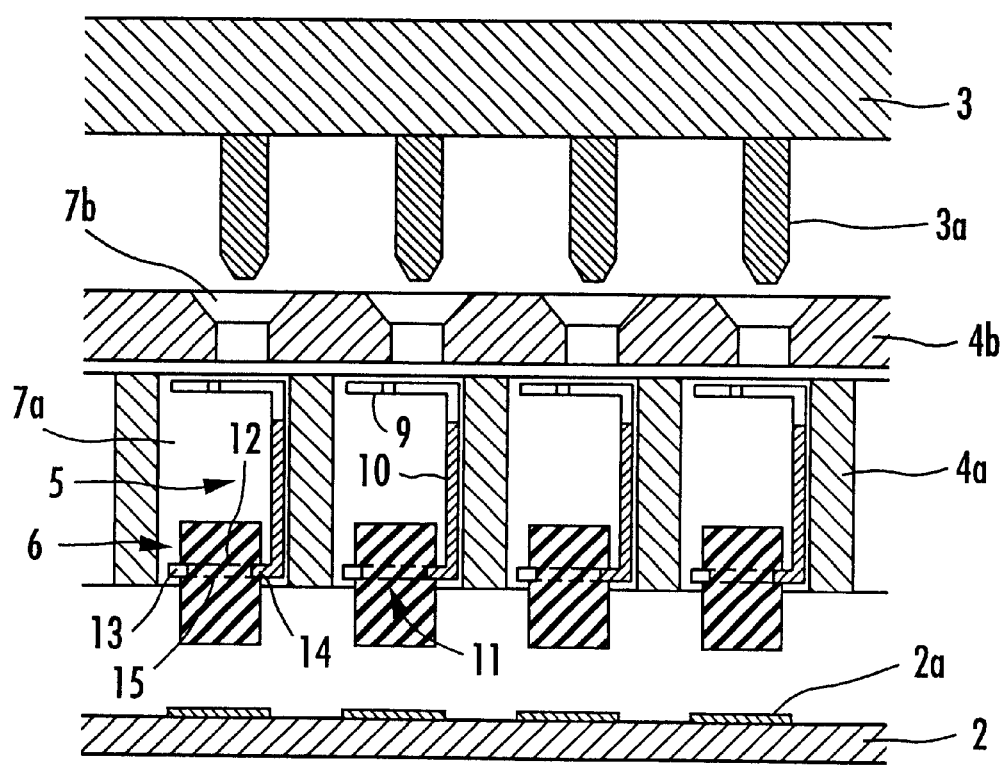
FIG. 2 is an enlarged fragmentary cross sectional view of the connector according to the first embodiment of the invention.

The case 4 comprises internal cases 4a facing the circuit board 2 and external cases 4b covering the internal cases 4a as shown in FIG. 2. The internal cases 4a are provided with through-holes 7 penetrating vertically corresponding to pins 3a of the CPU 3, and the external cases 4b are provided with through-holes 7b corresponding to pins 3a of the CPU 3. These external cases 4b are mounted on the internal cases 4a so that the external cases can slide over the internal cases 4a at a specified stroke by turning a lever 8 shown in FIG. 1.

Figure 4:
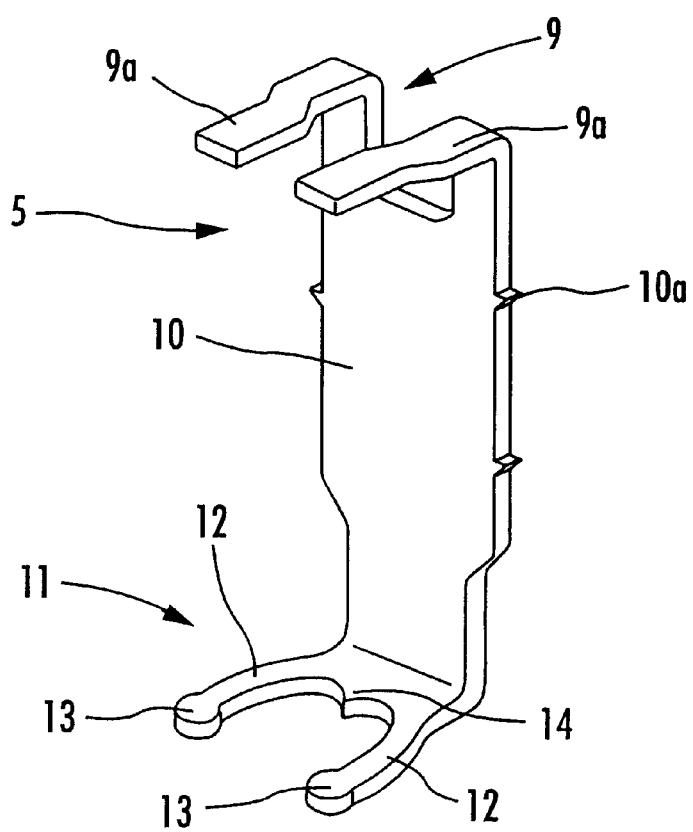
FIG. 4 is a schematic diagram showing a terminal of the connector according to the first embodiment.

The terminal 5 comprises a contact section 9 to be in contact with the pin 3a of the CPU 3 and a body section 10 to be press fitted in the through-hole 7a of the internal case 4a, and a connecting section 11 facing an electrical circuit 2a of the circuit board 2 as shown in FIGS. 2 and 4. The connecting section 11 extends forward so that a pair of bar-like pieces 12 are substantially in parallel with the circuit board 2 as shown in FIG. 2. The tip ends of these bar-like pieces 12 are provided with first claw sections 13, and a root section of the bar-like pieces 12 is provided with a second claw section 14 protruding forward. The pair of bar-like pieces 12 are bent so that the ends of the first claw sections 13 are in contact with each other and an internal passage 15 is formed inside the pair of bar-like pieces when the solder 6 is held as shown in FIG. 6(b).

The contact section 9 is formed to have two arm sections 9a bent forward from the body section 10. In these arm sections 9a, a portion close to the body section 10 is widely open and curves to narrow toward the tip end. In this contact section 9, the pin 3a of the CPU 3 is inserted into a large opening portion of the arms 16 through the through-holes 7a and 7b.

Figure 3:
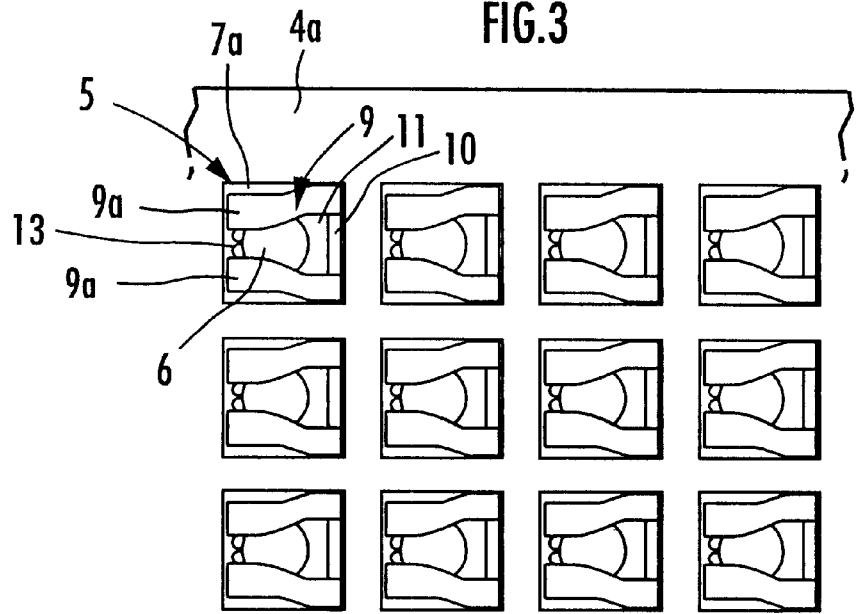
FIG. 3 is a partial plan view showing a state of an internal case according to the first embodiment.

The pin 3a is moved to a narrow portion of the arms 16 by operating the lever 8 to slide (to the left in FIG. 2) the external case 4b, then held between the pair of the arms 16 and connected. Side edges of the body section 10 are provided with claw sections 10a protruding in a width direction. These claw sections 10a perform positioning of the terminal 5 by penetrating into side walls of the through-hole 7a when the claw sections are inserted into the through-hole 7a provided in the internal case 4a as shown in FIG. 3. In addition, according to the first embodiment, the terminal 5 is gold plated all over the surface thereof.

Figure 6A:
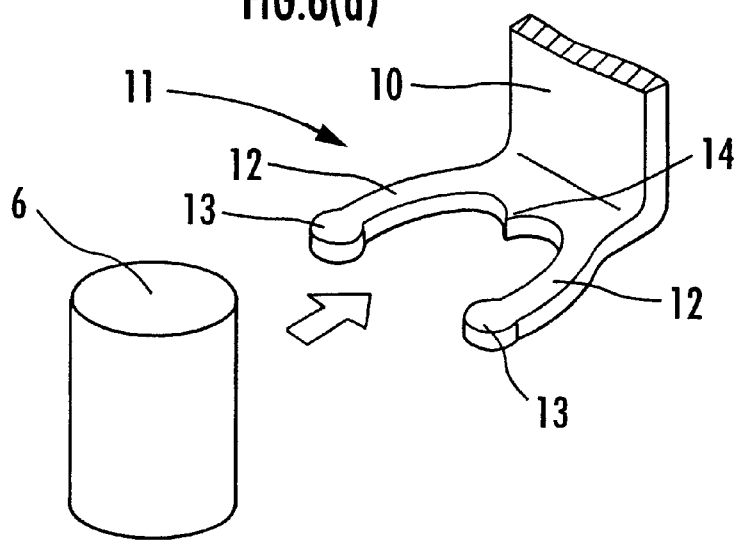
FIG. 6 is a schematic diagram showing a state of fixing a solder in the terminal.
Figure 6B:
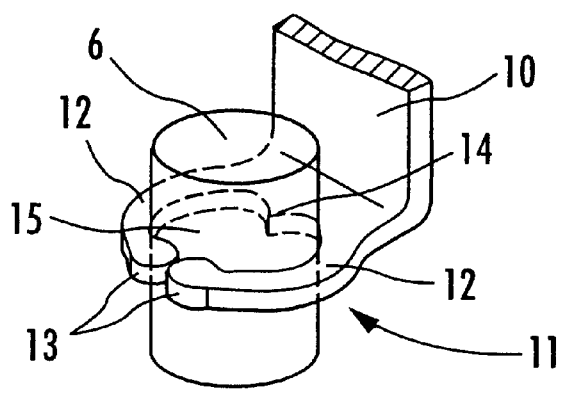

The solder 6 is fixed between the pair of the bar-like pieces 12 by caulking at the connecting section 11 of the terminal 5 as shown in FIG. 6(b). By this, as shown in FIG. 6(b), the solder 6 is arranged through the internal passage 15 across the connecting section 11. The solder 6 is formed into a circular column as shown in FIG. 6(a). Forming the solder 6 into the circular column like this facilitates manufacturing because the solder 6 can be manufactured only by cutting wire solder.

The method for manufacturing the connector 1 according to the first embodiment is described referring to FIGS. 5 and 6. The method for manufacturing the connector 1 according to the first embodiment comprises a case forming process, a terminal forming process, a conductive material fixing process, an attaching process and a horizontally aligning process.

In the case forming process, the internal cases 4a and the external cases 4b are formed by pouring insulating plastic into a mold (not illustrated) for the internal cases and a mold (not illustrated) for the external cases.

Figure 5A:
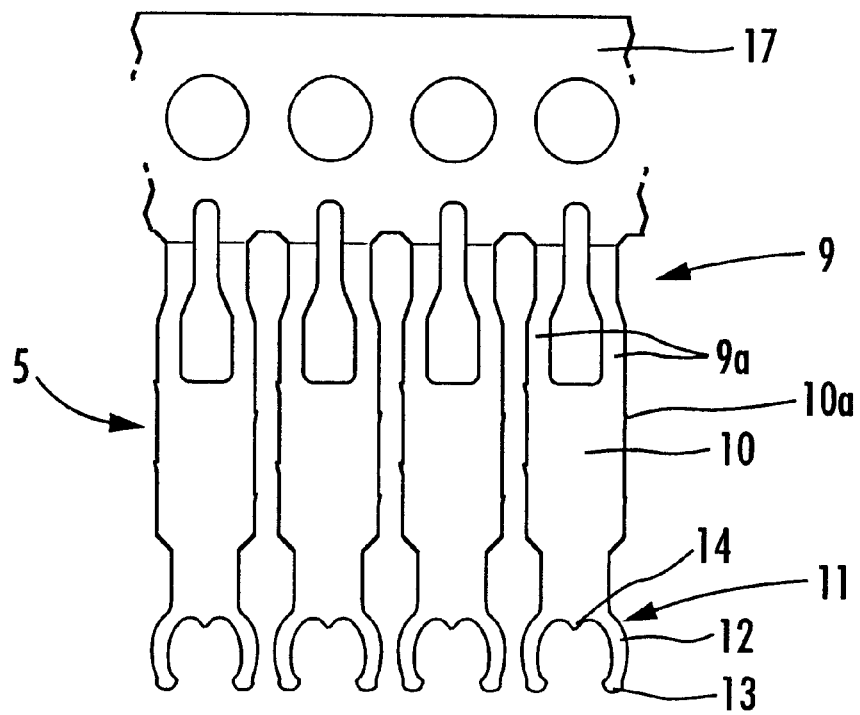
FIG. 5 is a schematic diagram showing a process for manufacturing the connector according to the first embodiment.
Figure 5B:
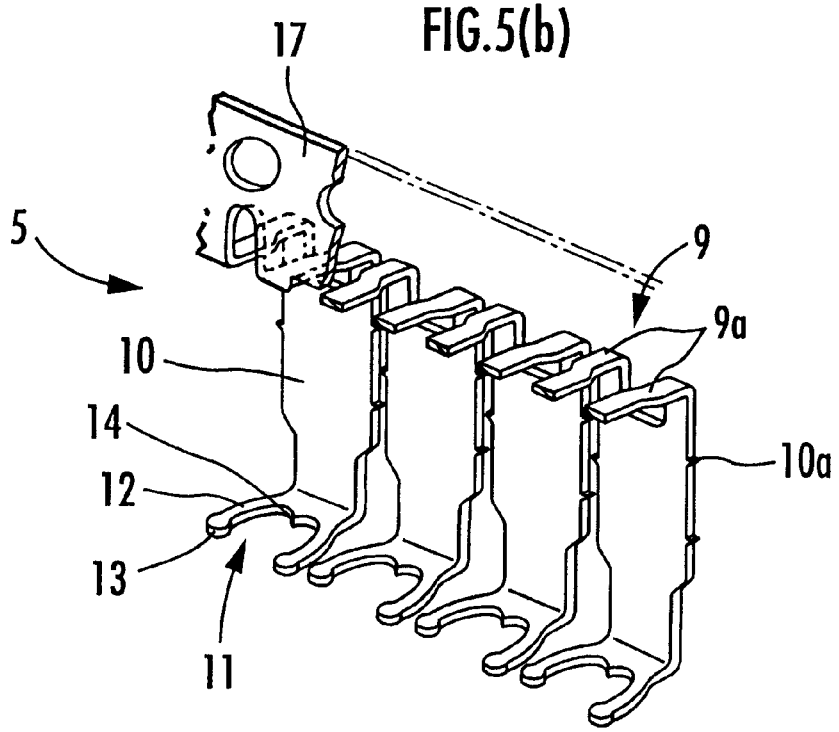

In the terminal forming process, the terminal 5 is formed by punching a metal sheet with a press not illustrated and performing bending work. More specifically, an outer shape of the terminal 5 is formed by punching the metal sheet as shown in FIG. 5(a). At this time the pair of bar-like pieces 12, the first claw sections 13 and the second claw section 14 are formed in the connecting section 11 simultaneously. Then the terminals 5 are formed by performing bending work and finishing work of a contact surface as shown in FIG. 5(b).

According to the first embodiment, these processes are performed in the condition a plurality of terminals 5 are connected in the width direction by a carrier 17. A pitch of the terminals 5 is designed to be equal to that of the through-holes 7 of the internal cases 4a. According to the first embodiment, the terminals 5 can be formed in the condition of being connected by the carrier 17 even when the pitch of the through-holes 7 of the internal case 4a is small because the terminals 5 are allowed to be in contact with the pins of the CPU at plate thickness portions of the connecting section 9 as shown in FIG. 2.

In the conductive material fixing process, the solder 6 is fixed to the terminal 5 by caulking as shown in FIGS. 6(a) and (b). More specifically, the solder 6 is inserted between the pair of bar-like pieces 12 from the front to allow the second claw section 14 to penetrate into the solder 6 and the tip ends of bar-like pieces 12 are bent inward to allow the first claw sections 13 to penetrate into the solder 6 to fix it by caulking as shown in FIG. 6(b). Thus, the solder 6 can be securely fixed to the connecting section 11 because the solder 6 is fixed at total three points, namely the pair of the first claw sections 13 located at the tip ends of pair of the bar-like pieces 12 and the second claw section 14 located at the root section. The connecting section 11 becomes to have an annular shape in the condition the solder 6 is fixed by caulking, and the internal passage 15 connecting the upper and lower sides of the connecting section 11 is formed inside the connecting section 11.

In the attaching process, the terminal 5 with the solder 6 fixed on the connecting section 11 by caulking is attached to the case 4. As the terminals 5 are connected by the carrier 17, and the pitch of the terminals 5 is designed to be equal to that of the through-holes 7 of the internal cases 4a, the terminals 5 can be easily attached to the through-holes 7 of the internal cases 4a. At this time, the claw sections 10a provided in the body section 10 of the terminal 5 penetrates into the side walls of the through-holes 7 to securely fix the terminal 5 inside the through-hole 7. After the terminals 5 are attached to the through-holes 7, the carrier 17 is cut off the terminals 5.

In the horizontally aligning process, an improvement of coplanarity of portions protruding from the bottom surface of the internal case 4a is performed in the condition the terminals 5 are attached to the internal case 4a. According to the first embodiment, the internal cases 4a attached with the terminals 5 are placed on a correction plate 18 to improve the coplanarity of the tip ends of the solder 6 as shown in FIG. 7. The correction plate 18 is heated at a temperature slightly less than a melting point of the solder 6. When the internal cases 4a attached with the terminals 5 are placed on the surface of the correction plate 18 like this, the solders protruding downward more than the other solders among a plurality of the solders 6 firstly contact with the correction plate 18.

As the above solders 6 are pressed downward by self-weight of the internal case 4a, and also heated by the correction plate 18, the tip ends thereof are deformed. Once the tip ends of a part of the solder 6 are deformed, the tip ends of the other solders further contact with the correction plate 18 to be deformed. Thus, the tip ends of the solders 6 protruding downward more than the other solders 6 are deformed in sequence by the correction plate 18, and finally the heights of the tip ends of the many solders 6 attached to the internal cases 4a are aligned. When the heights of the tip ends of the solders 6 are aligned, the self-weight of the internal cases 4a are distributively supported by the solders 6, and as the correction plate 18 is set at a temperature slightly less than a melting point of the solder 6, further deformation of the tip ends of the solders 6 is avoidable, and the coplanarity is improved.

After the terminals 5 and the solders 6 are attached to the internal cases 4a through the above processes, the external cases 4b and the lever 8 are installed in the above cases 4a to complete the connector 1 according to the first embodiment.

When the connector 1 according to the first embodiment is placed on the electrical circuit 2a to be surface-mounted on the circuit board, almost all the tip ends of the solders 6 contact with the electrical circuits 2a because the coplanarity of the tip ends of the solders 6 is high. Therefore, in this condition, when the connector 1 and the circuit board 2 are heated in a reflow furnace not illustrated, all the terminals 5 are securely connected to the electrical circuits 2a. As the solders of the connector 1 according to this embodiment protrude downward from the bottom of the internal cases 4a, a large clearance is secured between the internal cases 4a and the circuit board 2 so that the solders 6 are equally exposed to an ambient temperature and radiation heat in the reflow furnace.

On the other hand, a certain amount of deformation of the circuit board 2 or the internal cases 4a themselves is unavoidable. Therefore, the clearances between the connecting sections 11 of the terminals 5 and the electrical circuits 2a on the circuit board 2 are slightly different depending on each terminal 5. And, certain variation of an amount of the solder 6 attached to each terminal 5 is also unavoidable. However, the terminals 5 according to this embodiment are provided with the internal passages 15 connecting the upper and lower sides of the connecting sections 11, and the solder 6 exists at the upper and lower sides of the connecting section 11 (shaded area illustrated in FIG. 8). Once the solder 6 adheres to a base material (connecting section 11) like this, wettability of the solder 6 is secured at the upper and lower sides of the connecting section 11. Therefore, when the clearance between the connecting section 11 and the electrical circuit 2a is larger than the value specified in the standard or when an amount of the solder 6 at the lower side of the connecting section 11 is small as shown in FIG. 8(a), the solder 6 located at the upper side of the connecting section 11 flows downward through the internal passage 15. Thus, the space between the connecting section 11 and the electrical circuit 2a is filled with the melted solder 6 to ensure connection between them.

On the contrary, FIG. 8(b) shows cases in which the clearance between the connecting section 11 and the electrical circuit 2a is smaller than the value specified in the standard, or an amount of the solder 6 is large at the lower side of the connecting section 11. In these cases, the space between the connecting section 11 and the electrical circuit 2a is filled with the melted solder 6, and excessive solder 6 moves upward through the internal passage 15. Thus, it is avoided that the solder 6 extends in the right and left directions to reach the solder 6 of the adjacent terminal 5 or the electrical circuit 2a to cause short circuit.

As mentioned above, when the space between the connecting section 11 and the electrical circuit 2a is filled with the melted solder 6, the excessive solder 6 moves to the upper side of the connecting section 11 through the internal passage 15. On the contrary, when an amount of the solder 6 located at the lower side of the connecting section 11 is insufficient to fill the space between the connecting section 11 and the electrical circuit 2a, the solder 6 located at the upper side of the connecting section 11 moves downward through the internal passage 15 to fill the space between the connecting section 11 and the electrical circuit 2a. Thus, the solder 6 existing between the connecting section 11 and the electrical circuit 2a surely connects them.

Further, even when the coplanarity is so low that some solders 6 are not in contact with the electrical circuit 2a, the other solders 6 are always in contact with the electrical circuit 2a. When the solders 6 are heated in this condition, the solders in contact with the electrical circuits 2a are melted and the internal cases 4a move downward to allow the solders having not been in contact with the electrical circuits 2a to contact with the electrical circuits 2a.

A comparison example is described referring to FIG. 8(c). This comparison example uses the prior art terminal 51, and uses solder balls as a thermally fusible conductive material. A connecting section 52 of the terminal 51 is not provided with a connecting hole, but provided with a concave portion 53 for attaching the solder ball. When surface mounting was performed on the circuit board 2 using the prior art terminals 51 and the solder balls, the condition shown in FIG. 8(c) is sometimes recognized. More specifically, at the position where the clearance between the connecting section 52 of the terminal 51 and the electrical circuit 2a of the circuit board 2 is small, melted solder 6 sometimes flows out in the width direction of the connecting section 52 to connect the solder 6 of the adjacent connecting section 52 and the adjacent electrical circuit 2a to cause so called bridging. When an amount of the solder 6 is larger than the normal amount, the bridging is also recognized as shown in FIG. 8(c).

As mentioned above, according to the first embodiment, the solder 6 is surely fixed to the terminal 5 because the prior art solder balls are not used and the solders 6 are fixed to the terminals 5 in advance. In addition, manufacturing is easy and a production cost can be reduced because wire solder 6a at low cost can be used.

The standards for the clearance between the connecting section 11 and the electrical circuit 2a are different depending on types of the connector. When the connectors using the solder balls are manufactured according to the different standard, a diameter of the solder ball must be changed. As it is necessary to change equipment for positioning the solder balls at the time of welding the solder balls on the terminals, equipment investment is required, leading to manufacturing cost increase.

On the other hand, in the connector 1 according to the first embodiment, the solder 6 having a circular column shape is held between the pair of bar-like pieces 12 by caulking. Therefore, a length of the solder 6 protruding from the connecting section 11 toward the electrical circuit 2a side can be easily changed by changing the position of caulking. The length of the solder 6 protruding from the connecting section 11 toward the electrical circuit 2a side can be also changed easily by changing the total length of the solder 6. Thus, in the connector 1 according to the first embodiment, as only the length of the solder protruding from the connecting section 11 is required to be changed even when the clearance between the connecting section 11 and the electrical circuit 2a is changed, it is easy to deal with the change of the clearance.

A clearance (standoff) between the case 4 and the circuit board 2 at the time the connector 1 is placed on the circuit board 2 in the condition the terminals 5 and the solders 6 are installed in the case 4 may be different depending on each standard. However, according to the first embodiment, the standoff can be easily changed by changing the length of the solder protruding from the connecting section 11 to the electrical circuit 2a side. Therefore, it is easy to deal with various types of the standard without making large scale equipment investment.

Figure 6C:
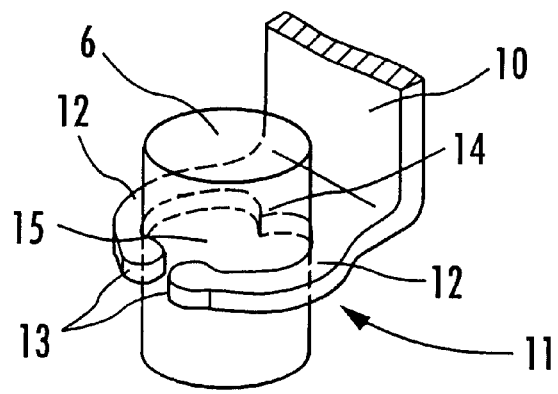

According to the first embodiment, the connecting section 11 is formed into an annular shape by allowing the tip ends of pair of the bar-like pieces 12 to contact with each other. However, without limiting to this, the connecting section 11 can be formed into a C-letter-like shape by providing a clearance between the tip ends of the bar-like pieces 12, as shown in FIG.6(c). Even when the connecting section 11 is formed into the C-letter-like shape like this, the upper and the lower sides of the connecting section 11 are connected by the internal passage 15 because the internal passage 15 is formed inside the bar-like pieces 12. Thus, when the solder is heated and melted, the solder can freely move between the upper and lower sides of the connecting section 11 through the internal passage 15 to surely connect the connecting section 11 to the electrical circuit 2a.

According to the above embodiment, the circular column-shaped solder 6 is used as the thermally fusible conductive material. However, without limiting to this, a solder 6a containing flux 20 can be used as shown in FIG. 9(a). By using the solder 6a containing the flux 20 like this, when the solder 6a is heated in the reflow furnace not illustrated, the solder 6a located at the upper and lower sides of the connecting section 11 can be easily melted because the flux 20 exists there. Thus, as the solder 6a is melted in the reflow furnace in a short time, it is possible to reduce the time for surface-mounting the connector 1 on the circuit board 2.

The cylindrical solder 6b having a central hole 21 can be used as shown in FIG. 9 (b). At this time, the solder 6b must be held by caulking between the bar-like pieces 12 while avoiding restricting the central hole 21. When such cylindrical solder 6b is used, the upper and lower sides of the connecting section 11 are connected through the central hole 21.

By the way, cream solder normally applied to the surface of the electrical circuit 2a often contains flux. When the connector 1 and the circuit board 2 are heated in the reflow furnace not illustrated, the cream solder is heated to evaporate the contained flux, which then rises through the central hole 21 of the solder 6b. As this flux has a property to facilitate the solder to melt and this flux enters the interior of the solder 6b through the central hole 21, the solder 6b is melted in a short time.

According to the above embodiment, all the surfaces of the terminal 5 are gold plated. However, without limiting to this, the connecting section 11 and the contact section 9 can be plated with gold 22 and the surface of the body section 10 can be plated with nickel 23 as shown in FIG. 10. In this case, as the terminal is normally formed of a nickel-plated material, it is necessary to perform gold-plating only on the connecting section 11 and the contact section 9. The nickel plating has a property of solder wettability inferior to that of gold plating. Therefore, when the surface of the body section 10 is provided with the nickel plating 23, the space between the connecting section 11 and the electrical circuit 2a can be sufficiently supplied with the solder 6 because the solder heated and melted do not move upward along the surface of the body section 10.

As shown in FIG. 11(a), the body section 10 of the terminal 5 can be provided with a groove 24 in the width direction. In this case, it is preferable to provide the groove close to the connecting section 11. When the body section 10 is provided with the groove 24 close to the connecting section 11 like this, the heated and melted solder 6 moving upward along the surface of the body section 10 is blocked by this groove 24. Therefore, the space between the connecting section 11 and the electrical circuit 2a is sufficiently supplied with the solder 6. This groove 24 can be located only at the surface of the body section 10 as shown in FIG. 11(a), or can be formed so as to surround the body section 10 as shown in FIG. 11(b). It can be also located at different positions of the surface and the side of the body section 10 as shown in FIG. 11(c).

The body section 10 close to the connecting section 11 can be provided with a step 25 as shown in FIG. 11(d). When the step 25 is provided like this, this step 25 can also prevent the melted solder 6 from moving upward along the surface of the body section 10.

A connector 1a according to a second embodiment is described. According to the second embodiment, the connecting section 11 of the terminal 5 is formed to be a plate substantially in parallel with the circuit board 2, and the connecting section 11 is provided with a through-hole 31 penetrating from one side to the other as an internal passage as shown in FIG. 12.

In the solder 6 according to the second embodiment, the solder 6 at the lower side of the connecting section 11 is formed into a conical projection 32 having a diameter reducing toward the circuit board 2 as shown in FIG. 13(a). According to the second embodiment, as the other configurations are identical to the above first embodiment, detailed description is omitted by using the same numerals.

The connector 1a according to this second embodiment is manufactured in the following processes:

Firstly, in the terminal forming process, the terminal 5 is formed by punching a metal sheet by a press not illustrated and performing a bending work as according to the above first embodiment. At this time, the through-hole 31 is simultaneously formed in the connecting section 11 of the terminal 5.

In the conductive material fixing process, the solder 6 is fixed to the terminal 5 by a solder caulking device 33 shown in FIG. 14. This solder caulking device 33 comprises a terminal feeding section 34, a terminal feeding drum 35, a wire solder feeding section 36, a solder holder 37, a solder riveting section 38, and a servomotor 39 for driving the solder holder 37 and the terminal feeding section 35 as shown in FIG. 14(a). The wire solder 6a is first supplied toward the lower portion of the solder holder 37 by the wire solder feeding section 36, and cut into the specified length by a cutter built in the wire solder feeding section 36. Then the cut solders 6 are conveyed upward to the solder riveting section 38 by the solder holder 37. In the solder riveting section 38, the terminal 5 conveyed by the terminal feeding section 34 is retained by the feeding drum 35. The terminal feeding drum 35 is provided with a depression 35a formed into a round hole with a bottom having a diameter larger than that of the through-hole 31 and facing the surface (the left side surface in FIGS. 14b and 14c) of the connecting section 11 of the terminal 5 as shown in FIGS. 14(b) and 14(c).

In this condition, a rivet punch 40 is advanced from the right side to push out the solder 6 held in the solder holder 37 and hammered into the terminal 5 held by the terminal feeding drum 35 as shown in FIGS. 14(b) and (c). Then the solder 6 is inserted into the through-hole 31 provided at the connecting section 11 of the terminal 5 and reaches the depression 35a of the terminal feeding drum 35. In this condition, when the rivet punch 40 is further advanced, the solder 6 is deformed to have a width larger than that of the through-hole 31 and fixed to the connecting section 11 of the terminal 5 by caulking.

At this time, the solder at the terminal feeding drum side of the connecting section 11 is provided with a shape formed by the concave portion of the terminal feeding drum 35 and the solder at the other side of the connecting section 11 is provided with a conical projection 32 formed by the tip end of the rivet punch 40 as shown in FIG. 14 (c). According to the second embodiment, in this conductive material fixing process, the solder 6 is fixed by caulking in the condition the terminals 5 are connected by the carrier 17. Also in this conductive material fixing process, the terminals 5 with which the solders 6 fixed are sent to the next attaching process in the condition the terminals 5 are connected by the carrier 17. In addition, as the other processes are identical to the above embodiment, detailed description is omitted.

According to the second embodiment, the projection 32 can be melted in a short time because the solder 6 is provided with the thin-walled projection 32 differing from the prior art solder ball and heat easily concentrates at the tip end of the projection 32 at the heating in a reflow furnace. Thus, in the connector 1 according to this embodiment, connection between the terminals 5 and the electrical circuits 2a can be performed surely and in a short time.

According to the second embodiment, the shape of the projection 32 of the solder 6 can be easily changed because it is necessary to change only the shape of the tip end of the rivet punch 40. As the shape of the projection 32 is formed by the rivet punch 40 when the solder is fixed to the terminal 5 by caulking, variation of an amount of the protrusion of the projection 32 from the connecting section 11 can be reduced in comparison with the prior art solder ball.

According to the second embodiment, the projection 32 of the solder 6 is formed into a conical shape. However, without limiting to this, the tip end of the projection 32 can be formed into a cross shape protruding toward the circuit board 2 as shown in FIG. 13(b). When the projection 32 is formed into the protruding cross shape like this, the projection 32 can be also easily melted in a short time because the heat easily reaches the tip end of the cross shape.

As shown in FIG. 13(c), the solder 6 can be positioned so as to substantially cylindrically protrude toward the circuit board 2 side, and provided with an opening 41 having a diameter increasing toward the circuit board 2 formed by allowing the conical head of the rivet punch 40 to penetrate to the solder. When the projection 32 is formed like this, the solder can be easily melted because the heat easily reaches the tip end thereof. The cream solder containing flux is normally applied to the surface of the electrical circuit 2*a*. Therefore, when the solder is heated in the reflow furnace not illustrated, the flux contained in the cream solder is evaporated to accumulate in the opening 41 of the projection 32. As this flux facilitates melting of the solder 6, the solder 6 can be further melted in a short time. In addition, the projection shown in FIG. 13(*c*) can be formed into a rectangular column other than the circular column, and the opening 41 can be formed into a pyramid-shaped depression.

The solder 6 located at the upper side of the connecting section 11 can be formed into a flat oval shape by pressing from the right and left, and the solder 6 located at the lower side of the connection section 11 can be formed into a projection 32 having a cross shape by pressing and caulking the solder horizontally in the four directions as shown in FIG. 13(*d*). The projection 32 having a cross shape can be also formed by caulking in the right and left direction of the terminal 5.

A modified connector according to the second embodiment is described. In this modification, after the solder 6 is inserted into the through-hole 31 provided in the connecting section 11, the solder 6 is fixed by caulking by deforming the connecting section 11. More specifically, the solder 6 formed so as to be provided with a diameter slightly smaller than that of the through-hole 31 is inserted into the through-hole 31 to perform positioning as shown in FIG. 15(*a*). Then the solder 6 is fixed by caulking by deforming the connecting section 11 by a punch not illustrated from the side of the connecting section 11 to be formed into a heart-like shape as viewed horizontally. By deforming the connecting section 11 like this, the solder 6 can be securely fixed to the connecting section 11. In addition, as the other configurations of this modification are similar to the above second embodiment, detailed description is omitted by using the same numerals.

In this modification, the connecting section 11 can be deformed from the side of the connecting section 11 by using a pair of punches not illustrated to be formed into an 8-letter-like shape as viewed horizontally as shown in FIG. 15(*b*). The connecting section 11 can be also deformed in the three directions using a plane-shaped punch not illustrated to be formed into a rectangular shape as viewed horizontally as shown in FIG. 15(*c*).

As shown in FIG. 15(*d*), the solder 6 formed so as to have a diameter (D+α) slightly larger than the diameter (D) of the through-hole 31 can be press fitted into the through-hole 31. The solder 6 can be also securely fixed to the connecting section 11 by press fitting the solder 6 in the through-hole 31 like this.

As shown in FIG. 15(*e*), the internal periphery of the through-hole 31 can be provided with projections 42 to allow them to penetrate into the solder 6 when it is press fitted in the thorough-hole 31. Thus, the solder 6 can be fixed to the connecting section 11 more securely by allowing the projections 42 to penetrate into the solder 6.

The solder 6 can be also fixed by caulking by bending the connecting section 11 upward in the diagonal direction using a punch not illustrated and deforming the connecting section 11 to provide V-letter-like shape as viewed from the side after inserting the solder 6 into the through-hole 31 as shown in FIG. 15(*f*).

Another modification according to the second embodiment of the invention is described. In the connector of the other modification according to the second embodiment, the connecting section 11 of the terminal 5 is provided with a recess 43 cut in from the tip ends toward the body section 10 as shown in FIG. 16. The solder 6 is formed to be provided with the projection 32 having a conical shape as shown in FIG. 16. In addition, as the other configurations of this modification according the second embodiment are similar to the above embodiment, detailed description is omitted by using the same numerals.

The connector of another modification according to the second embodiment is manufactured in the following processes:

In the terminal forming process, the terminal 5 is formed by punching a metal sheet by a press not illustrated and performing bending work similarly to the above embodiment. At this time, the recess 43 cut in from the tip ends of the connecting section 11 of the terminal 5 toward the body section 10 is formed simultaneously. In the conductive material fixing process, the solder 6 is press fitted in the recess 43 provided in the connecting section 11 from the front as shown in FIGS. 16(*a*) and (*b*). According to this embodiment, as the diameter of the solder 6 is made to be slightly larger than the inner width of the recess 43, the solder 6 can be fixed to the connecting section 11 only by press fitting the solder 6 in the recess 43. In the horizontally aligning process, coplanarity of the tip ends of the projections 32 is improved by pressing the internal case 4*a* downward without heating the correction plate 18 as shown in FIG. 17. In addition, as the other processes are identical to those of the above embodiment, detailed description is omitted.

In a connector of another modification according to the second embodiment, the solder 6 formed into a conical shape in advance is easily manufactured differing from the prior art solder ball. It is difficult to form the prior art solder balls using a mold or the like because generation of burrs on the surface thereof is unavoidable. On the other hand, the solder 6 of the other modification according to the second embodiment has no problem in forming by using a mold or the like because the burrs and the like are removed in the above horizontally aligning process and the coplanarity of the tip end of each terminal 5 is kept even if the tip ends of the projections 32 have the above burrs and the like. Therefore, the cost can be reduced in comparison with the use of the solder balls because the solder can be easily formed into a specified shape. When the connecting section 11 is provided with the recess 43 cut in from the tip end side, the upper and lower sides of the connecting section 11 is connected by this recess 43. Thus, when the solder is heated and melted, it can freely move between the upper and lower sides of the connecting section 11 through this recess 43 and the connecting section 11 and the electrical circuit 2*a* can be surely connected.

A third embodiment of the invention is described. According to the third embodiment, a connecting section 11 is provided with a pair of recesses 44 at both sides in the width direction to form the connecting section 11 into an H-letter-like shape as shown in FIG. 18. A wire solder 6*a* is used as a thermally fusible conductive material as shown in FIG. 18.

According to this third embodiment, the wire solder 6*a* is wound around the pair of recesses 44 of the connecting section 11 having the H-letter-like shape, and thereafter cut at the specified length to be fixed around the connecting section 11. The wire solder 6*a* can be also fixed to the connecting section 11 securely by being wound around the pair of recesses 44 like this. In addition, according to this embodiment, the wire solder 6a cut at the specified length in advance can be wound around the pair of recesses 44.

A method for manufacturing a connector according to another embodiment of the invention is described. The method for manufacturing the connector according to this embodiment comprises a terminal forming process, an attaching process, a conductive material forming process and a conductive material fixing process. According to this embodiment, the attaching process, the conductive material forming process and the conductive material fixing process are different from those according to the above first embodiment, and description of the other process is omitted because it is similar to that according to the above first embodiment.

In the attaching process, the terminal 5 is attached to the through-hole 7 of the internal case 4a in the condition the solder 6 is not yet attached to the terminal 5.

In the conductive material forming process, the solder 6 shown in FIG. 19(a) is formed by melting the wire solder 6a or a plate solder not illustrated, or subject them to press work. This solder 6 comprises a conical projection 32 protruding toward the circuit board 2 and an inserting section 46 extending upward from this projection 32. The inserting section 46 is formed to have a diameter smaller than that of the internal passage 15 provided to the connecting section 11.

In the conductive material fixing process, the solders 6 are arranged by a solder holder 47 as shown in FIG. 19(a). Then the solder holder 47 is advanced toward the internal case 4a attached with the terminal 5. Thus, the inserting section 46 of the solder 6 is inserted into the internal passage 15 provided to the connecting section 11 as shown in FIG. 19(b). Punches 48 are inserted from the upper side of the through-hole 7 to deform the inserting section 46 of the solder 6 and to fix the solder 6 to the connecting section 11 by caulking as shown in FIG. 19(c).

By this method for manufacturing the connector according to this embodiment, the solder 6 is not fixed to the terminal 5 before being attached to the internal case 4a, but the solder 6 can be fixed to the terminal 5 even after the terminal 5 is attached to the internal case 4a. In addition, in this method for manufacturing the connector according to this embodiment, the connecting section 11 can be also provided with a recess cut in from the tip end side of the connecting section 11 instead of the internal passage 15.

Although each of the above embodiments has been described taking a socket to be attached with the CPU 3 as an example. However, without limiting to this, the connector may be an attachable one which can freely connect another IC or a circuit board to another circuit board, as long as it is surface-mounted on the circuit board 2.

What is claimed is:

1. A connector to be surface-mounted on a circuit board having an electrical circuit and used to attachably connect an integrated circuit or another connector provided with a plurality of pins extending downward to the circuit board comprising:

a case made of an insulating material;

a through-hole penetrating said case vertically and into which said pin is inserted;

a terminal having a contact section provided in said through-hole to be in contact with said pin, a connecting section facing said electrical circuit and a body section joining said contact section and said connecting section; and a thermally fusible conductive material existing between said connecting section and said electrical circuit;

wherein said connecting section extends substantially in parallel with said circuit board and is provided with an internal passage connecting upper and lower sides of said connecting section, and said thermally fusible conductive material is attached to said connecting section in a manner of extending both upward and downward through said internal passage in a state in which said thermally fusible conductive material is not heated and has not been fused to said circuit board, and wherein a longitudinal axis of the thermally fusible conductive material is substantially perpendicular to a plane of said circuit board.

2. A connector according to claim 1, wherein said thermally fusible conductive material is freely movable between the upper and lower sides of said connecting section through said internal passage when said thermally fusible conductive material is heated and melted, when said connector is surface-mounted on said circuit board, said thermally fusible conductive material is heated and melted in the condition said thermally fusible conductive material is in contact with said electrical circuit, and when a space formed between said connecting section and said electrical circuit is filled with the heated and melted thermally fusible conductive material, an excessive thermally fusible conductive material contained between said connecting section and said electrical circuit moves to the upper side of said connecting section through said internal passage.

3. A connector according to claim 1, wherein said thermally fusible conductive material is freely movable between the upper and lower sides of said connecting section through said internal passage when said thermally fusible conductive material is heated and melted, such that when said connector is surface-mounted on said circuit board, said thermally fusible conductive material is heated and melted in a condition in which said thermally fusible conductive material is in contact with said electrical circuit, and the thermally fusible conductive material existing on the upper side of said connecting section moves to the lower side of said connecting section through said internal passage.

4. A connector according to any one of claims 1 through 3, wherein said connecting section comprises a pair of bars extending and branching substantially in parallel with said circuit board, and said internal passage is formed by allowing tip ends of said pair of bars to be close to or in contact with each other.

5. A connector according to any one of claims 1 through 3, wherein said connecting section comprises a plate substantially in parallel with said circuit board, and said internal passage comprises a through-hole connecting the upper and lower sides of said connecting section.

6. A connector according to any one of claims 1 through 3, wherein a surface of the body section close to said connecting section is provided with a groove or a step.

7. A connector according to any one of claims 1 through 3, wherein the surface of the body section close to said connecting section is coated with a substance having low wettability of solder.

8. A connector according to claim 1, wherein said connecting section comprises a pair of bars extending and branching substantially in parallel with said circuit board, and said thermally fusible conductive material is held between said pair of bars by caulking.

9. A connector according to claim 8, wherein said pair of bars comprises a pair of first claw sections protruding inward from both sides of the bars at tip ends of said bars and a second claw section protruding toward the tip ends of said pair of bars at a root section of the bars, and when said thermally fusible conductive material is fixed to said pair of bars by caulking, said first claw sections and said second claw section penetrate into said thermally fusible conductive materials.

10. A connector according to claim 8 or 9, wherein said pair of bars at said connecting section are formed into an annular shape by allowing tip ends thereof to be in contact with each other.

11. A connector according to claim 8 or 9, wherein said pair of bars at said connecting section are formed by allowing tip ends thereof to have a specified clearance.

12. A connector to be surface-mounted on a circuit board having an electrical circuit and used to attachably connect an integrated circuit or another circuit provided with a plurality of pins extending downward to the circuit board comprising:
- a case made of an insulating material;
- a through-hole penetrating said case vertically and into which said pin is inserted;
- a terminal having a contact section provided in said through-hole to be in contact with said pin and a connecting section facing said electrical circuit; and
- a thermally fusible conductive material existing between said connecting section and said electrical circuit;
- wherein said connecting section is formed to be a plate substantially in parallel with said circuit board and is provided with an internal passage penetrating from one side to the other of said plate, and said thermally fusible conductive material is inserted through said internal passage and fixed, and said thermally fusible conductive material is attached to said connecting section in a manner of extending both upward and downward through said internal passage in a state in which said thermally fusible conductive material is not heated and has not been fused to said circuit board, and wherein a longitudinal axis of the thermally fusible conductive material is substantially perpendicular to a plane of said circuit board.

13. A connector according to claim 12, wherein said internal passage comprises a round hole, and said thermally fusible conductive material is fixed by caulking by crushing said round hole at a side of said connecting section from one side to deform said hole.

14. A connector according to claim 12, wherein said internal passage comprises a round hole, and said thermally fusible conductive material is fixed by caulking by crushing said round hole at the sides of said connecting section from at least three sides to deform it into a nearly rectangular shape hole as viewed horizontally.

15. A connector according to claim 12, wherein said internal passage comprises a connecting hole, and said thermally fusible conductive material is fixed by caulking by externally pressing and bending said connecting section in a diagonal direction to reduce an opening area of said connecting hole.

16. A connector according to claim 12, wherein said internal passage comprises a connecting hole, and thermally fusible conductive material is fixed to said connecting section by caulking by deforming to make a width larger than that of said connecting hole at the upper and lower sides of said connecting section in a condition said thermally fusible conductive material is inserted into said connecting hole.

17. A connector according to claim 12, wherein said internal passage comprises a connecting hole, and said thermally fusible conductive material is fixed by being press fitted in said connecting hole.

18. A connector according to claim 12, wherein said internal passage comprises a recess cut in from tip ends of said connecting section, and said thermally fusible conductive material is fixed by being press fitted in said recess.

19. A connector according to claim 1, wherein said thermally fusible conductive material is provided with a projection having a wall thickness reducing toward said circuit board side.

20. A connector according to claim 19, wherein said projection is formed into a conical shape having a diameter reducing toward said circuit board.

21. A connector according to claim 19, wherein said projection is formed into a cross shape toward said circuit board.

22. A connector according to claim 19, wherein said projection is formed into a cylinder toward said circuit board, and internally provided with a depression having a diameter enlarging toward said circuit board side.

23. A connector according to claim 1, 8, 12, 17, or 19, wherein said thermally fusible conductive material is a solder formed into a cylindrical body extending vertically which is filled with flux.

24. A connector according to claim 1, 8, 12, 17, or 18, wherein said thermally fusible conductive material is a cylindrical solder having a central hole penetrating vertically, and attached to said connecting section to connect between the upper and lower sides of said connecting section by said central hole.

25. A connector to be surface-mounted on a circuit board having an electrical circuit and used to attachably connect an integrated circuit or another connector provided with a plurality of pins extending downward to the circuit board comprising:
- a case made of an insulating material;
- a through-hole penetrating said case vertically and into which said pin is inserted;
- a terminal having a contact section provided in said through-hole to be in contact with said pin and a connecting section facing said electrical circuit; and
- a thermally fusible conductive material existing between said connecting section and said electrical circuit;
- wherein said connecting section comprises a pair of bars extending and branching substantially in parallel with said circuit board, and said thermally fusible conductive material is held between said pair of bars by caulking, and said pair of bars at said connecting section are formed into an annular shape by allowing tip ends of the bars to be in contact with each other, and
- wherein said pair of bars comprises a pair of first claw sections protruding inward from both sides at tip ends and a second claw section protruding toward the tip ends of said pair of bars at a root section, and when said thermally fusible conductive material is fixed to said pair of bars by caulking, said first claw section and said second claw section penetrate into said thermally fusible conductive material.

* * * * *